United States Patent
Koyama et al.

(10) Patent No.: US 9,082,583 B2
(45) Date of Patent: Jul. 14, 2015

(54) SAMPLE HOLDER AND METHOD FOR FIXING OBSERVATION SAMPLE

(71) Applicant: Hitachi High-Technologies Corporation, Minato-ku, Tokyo (JP)

(72) Inventors: Kazuhiro Koyama, Tokyo (JP); Masahiro Akatsu, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/405,485

(22) PCT Filed: May 30, 2013

(86) PCT No.: PCT/JP2013/065065
§ 371 (c)(1),
(2) Date: Dec. 4, 2014

(87) PCT Pub. No.: WO2013/183543
PCT Pub. Date: Dec. 12, 2013

(65) Prior Publication Data
US 2015/0137002 A1    May 21, 2015

(30) Foreign Application Priority Data
Jun. 6, 2012   (JP) ................................ 2012-128766

(51) Int. Cl.
*H01J 37/20* (2006.01)
*H01J 37/26* (2006.01)
(Continued)

(52) U.S. Cl.
CPC ................ *H01J 37/20* (2013.01); *H01J 37/28* (2013.01); *H01J 2237/202* (2013.01); *H01J 2237/2007* (2013.01); *H01J 2237/2801* (2013.01)

(58) Field of Classification Search
CPC ............... H01J 37/20; H01J 2237/201; H01J 2237/202; H01J 2237/2007; H01J 37/26; H01J 37/153; H01J 2237/20; H01J 2237/26; G01N 2001/028; G01N 23/2251; G01N 1/00

USPC ............. 250/440, 11, 442.11, 306, 307, 310, 250/311, 491.1, 492.1
See application file for complete search history.

(56) References Cited

U.S. PATENT DOCUMENTS

2005/0133718 A1* 6/2005 Miyamoto et al. ............ 250/307
2008/0093565 A1* 4/2008 Yaguchi et al. ........... 250/440.11
(Continued)

FOREIGN PATENT DOCUMENTS

| JP | 2000-200577 A | 7/2000 |
| JP | 2001-338599 A | 12/2001 |

(Continued)

OTHER PUBLICATIONS

International Search Report (PCT/ISA/210) dated Jul. 16, 2013 with English translation (four pages).
(Continued)

*Primary Examiner* — Nikita Wells
(74) *Attorney, Agent, or Firm* — Crowell & Moring LLP

(57) ABSTRACT

A sample holder is provided allowing for favorable observation of a cross-sectional sample using a retarding method. The sample holder includes: a sample placement member on which a first fixing member, a cross-sectional sample as an observation sample, and a second fixing member are placed in contact with each other, and inserted inside the electronic optical lens barrel of an electron microscope; and a voltage introduction means for introducing a voltage to the sample placement member. The sample placement member has a positioning section for positioning the first fixing member, the cross-sectional sample, and the second fixing member onto a placement position. A positioning section positions the first planar surface of the first fixing member and the second planar surface of the second fixing member which are disposed respectively adjacent to the observation surface of the cross-sectional sample, parallel to the observation surface at locations equidistant from the observation surface.

13 Claims, 11 Drawing Sheets

(51) Int. Cl.
*G21K 5/08* (2006.01)
*H01J 37/28* (2006.01)

(56) References Cited

U.S. PATENT DOCUMENTS

2008/0308731 A1* 12/2008 Nishiyama et al. ........... 250/310
2013/0146766 A1 6/2013 Ohshima et al.

FOREIGN PATENT DOCUMENTS

JP 2010-056078 A 3/2010
WO WO 2012/023354 A1 2/2012

OTHER PUBLICATIONS

Japanese-language Written Opinion (PCT/ISA/237) dated Jul. 16, 2013 (four pages).

* cited by examiner

SAMPLE HOLDER AND METHOD FOR FIXING OBSERVATION SAMPLE

TECHNICAL FIELD

The present invention relates a specimen holder which is used for holding a specimen under observation having an observation face to be observed by an electron microscope, and in particular, relates to a specimen holder which enables satisfactory observation of a cross-sectional specimen as the specimen under observation by the retarding method in an electron microscope. In addition, the present invention also relates to a method for fixing the specimen under observation to the specimen holder.

BACKGROUND ART

The electron microscope is configured to obtain a magnified image of a face to be observed of a specimen under observation, by arranging the specimen inside an electron-optical lens-barrel, irradiating the specimen with a primary electron beam which is emitted from an electron gun and focused by magnetic lenses, and detecting secondary charged particles which are emitted from the specimen by the irradiation with the primary electron beam. (Hereinafter, the specimen under observation may be simply referred to as "the specimen", the face to be observed is referred to as "the observation face", and the magnified image is referred to as "the specimen image".)

The electron microscope is configured to use a specimen holder, which is provided for observation of a cross-sectional specimen when the cross-sectional specimen is observed as the specimen under observation. The "cross-sectional specimen" means a specimen under observation having a cleaved portion. For example, the semiconductor manufacturers are performing analyses of defects in semiconductor wafers, manufacturing processes, and others by observing cross-sectional portions of cleaved semiconductor wafers by electron microscopes. In such cases, the cleaved semiconductor wafers and the like are the "cross-sectional specimen".

The specimen holder for observation of a cross-sectional specimen is a member for facilitating fitting the cross-sectional specimen to the electron microscope. (See, for example, Patent Literature 1.) When the specimen holder, inside which the cross-sectional specimen is loaded, is inserted inside the electron-optical lens-barrel of the electron microscope, the specimen holder disposes the cross-sectional specimen at a predetermined location which is appropriate for observation. The specimen holder is configured to hold the cross-sectional specimen at the above location in such a manner that the observation face of the cross-sectional specimen perpendicularly intersects with the primary electron beam.

In particular, the specimen holder disclosed in Patent Literature 1 is configured such that the observation position of the cross-sectional specimen relative to the primary electron beam is unchanged at all times, and the cross-sectional specimen can be easily fitted to the electron microscope, so that it is possible to prevent the object from going out of sight. The conventional specimen holders, which are typified by the specimen holder of Patent Literature 1, are arranged such that a space exists around the observation face of the cross-sectional specimen when the cross-sectional specimen is loaded.

The scanning electron microscope is a type of the electron microscope. The scanning electron microscope is configured to have, in addition to the aforementioned configuration of the electron microscope, a function of scanning over the specimen with the primary electron beam by use of a magnetic-field or electric-field deflector which is arranged above an objective lens.

In the conventional scanning electron microscopes, the specimen is grounded when the specimen image is obtained. However, recently, use of the retarding (deceleration) method, in which a negative voltage is applied to the specimen when the specimen image is obtained, has been becoming predominant. The retarding method is a technique for obtaining a specimen image by applying a negative voltage (retarding voltage) of approximately hundreds of volts to several kilovolts to the specimen so as to decelerate the primary electron beam immediately in front of the specimen.

According to the retarding method, the voltage (acceleration voltage) Vacc applied to the primary electron beam accelerated by the electron gun and the voltage (retarding voltage) Vr applied to the specimen give the irradiation voltage Vi (which may be referred to as the landing energy) as follows.

$$Vi = Vacc - Vr$$

The scanning electron microscopes can obtain a specimen image at the same irradiation voltage with higher image quality when the retarding method is used than when the retarding method is not used (i.e., when the specimen is grounded).

For example, in either of the case where Vacc=1 kV and Vr=0.5 kV and the case where Vacc=0.5 kV and Vr=0 V, the irradiation voltage is the identical value of 0.5 kV. However, the resolution (i.e., the degree of clearness in the appearance of the specimen image) is better in the former case.

In addition, when a retarding means is used, the scanning electron microscope can also obtain a specimen image at an irradiation voltage (e.g., Vi=0.1 kV) lower than the minimum acceleration voltage (e.g., Vacc=0.5 kV) which can be realized by the electron gun.

As mentioned above, when a retarding means is used, the scanning electron microscope can realize high-resolution morphological observation of the observation face of the specimen. In addition, when a retarding means is used, the scanning electron microscope can achieve various effects including suppression of electrification of the specimen and reduction of damage on the specimen.

Further, the scanning electron microscopes can be classified into three types, the out-lens type, the in-lens type, and the semi-in-lens type. The out-lens type scanning electron microscope is configured such that the specimen is arranged at a position completely apart from the lens magnetic field of the objective lens. The in-lens type scanning electron microscope is configured such that the specimen is arranged in the lens magnetic field of the objective lens. The semi-in-lens type scanning electron microscope is intermediate between the out-lens type and the in-lens type, and configured such that the specimen is arranged at a position to which a portion of the lens magnetic field of the objective lens leaks.

Among the three types of scanning electron microscopes, the in-lens type scanning electron microscope is more advantageous than the other types because the in-lens type scanning electron microscope can most efficiently utilize the lens power of the objective lens and obtain a specimen image with high resolution. (Hereinafter, the in-lens type scanning electron microscope is referred to as the "in-lens SEM".

However, in the in-lens SEM, the specimen is required to be arranged in the lens magnetic field of the objective lens. Therefore, the in-lens SEM is configured such that the specimen is loaded in the tip end of a dedicated specimen holder, and the specimen holder is inserted in the lens magnetic field of the objective lens. In the in-lens SEM having such a configuration, the specimen and the specimen holder are arranged in a narrow space.

On the other hand, according to the aforementioned retarding method, a negative voltage at the same level (on the same order) as the acceleration voltage of the primary electron beam is applied to the specimen. Therefore, in consideration of the possibility of electric discharge or leakage, almost no conventional in-lens SEM adopts the retarding method. Nevertheless, since a technique for preventing the electric discharge or leakage has been developed in recent years, the retarding method has been becoming able to be adopted in the in-lens SEM.

CITATION LIST

Patent Literature

Patent Literature 1: Japanese Patent Laid-open No. 2010-56078

SUMMARY OF INVENTION

Technical Problem

Since the negative voltage is applied to the specimen according to the retarding method, in the case where a protruding portion or a recessed portion exists around the observation face of the specimen, the retarding electric field around the observation face of the specimen becomes uneven, so that phenomena such as unevenness of brightness, image deformation, and deterioration of resolution occur.

In particular, in the in-lens SEM, the distance between the specimen and a lens is short, and the focal depth is small. Therefore, the above phenomena are markedly likely to occur in the in-lens SEM, compared with the out-lens type. Consequently, in the case of the in-lens SEM, it is particularly necessary to prevent unevenness of the retarding electric field around the observation face of the specimen.

However, in the case where the cross-sectional specimen is loaded in the conventional specimen holder typified by Patent Literature 1, a space exists around the observation face of the cross-sectional specimen. Therefore, when a cross-sectional specimen is observed by use of the retarding method and the conventional specimen holder in the in-lens SEM, a protruding portion or a recessed portion exists around the observation face of the specimen, so that the retarding electric field around the observation face of the specimen becomes uneven, and the phenomena such as unevenness of brightness, image deformation, and deterioration of resolution occur. Consequently, it is impossible to satisfactorily observe the cross-sectional specimen by use of the retarding method and the conventional specimen holder in the in-lens SEM.

The present invention has been developed in order to solve the above problem. The main object of the present invention is to provide a specimen holder which enables satisfactory observation of a cross-sectional specimen as a specimen under observation, by the retarding method in an electron microscope, and to provide a method for fixing a specimen under observation to the specimen holder.

Solution to Problem

In order to achieve the object, the present invention provides a specimen holder including: a specimen mounting portion on which a first fixing member, a cross-sectional specimen as a specimen under observation, and a second fixing member, arranged in close contact with each other, are mounted, and which is to be inserted inside an electron-optical lens-barrel in an electron microscope; and a voltage introduction means which introduces a voltage to the specimen mounting portion. In the above specimen holder, the specimen mounting portion includes a positioning portion which positions the first fixing member, the cross-sectional specimen, and the second fixing member in mounting positions; and the positioning portion positions a first flat face and a second flat face in positions parallel to an observation face and equally distant from the observation face, where the observation face is a cross section to be observed of the cross-sectional specimen, the first flat face is a face of the first fixing member to be arranged adjacent to the observation face, and the second flat face is a face of the second fixing member to be arranged adjacent to the observation face.

In the above specimen holder, the positioning portion positions the first flat face of the first fixing member and the second flat face of the second fixing member in the positions parallel to the observation face and equally distant from the observation face.

In the above specimen holder, the first flat face of the first fixing member and the second flat face of the second fixing member can be arranged adjacent to the observation face of the cross-sectional specimen so as to cancel out the nonuniformity of the retarding electric field around the observation face of the cross-sectional specimen when the cross-sectional specimen is the specimen under observation. Therefore, the above specimen holder can uniformize the retarding electric field around the observation face of the cross-sectional specimen. As a result, the above specimen holder enables satisfactory observation of the cross-sectional specimen.

Other means are explained later.

Effect of Invention

The present invention enables satisfactory observation of a cross-sectional specimen as a specimen under observation, by the retarding method in an electron microscope.

DESCRIPTION OF EMBODIMENT

Figure 1:
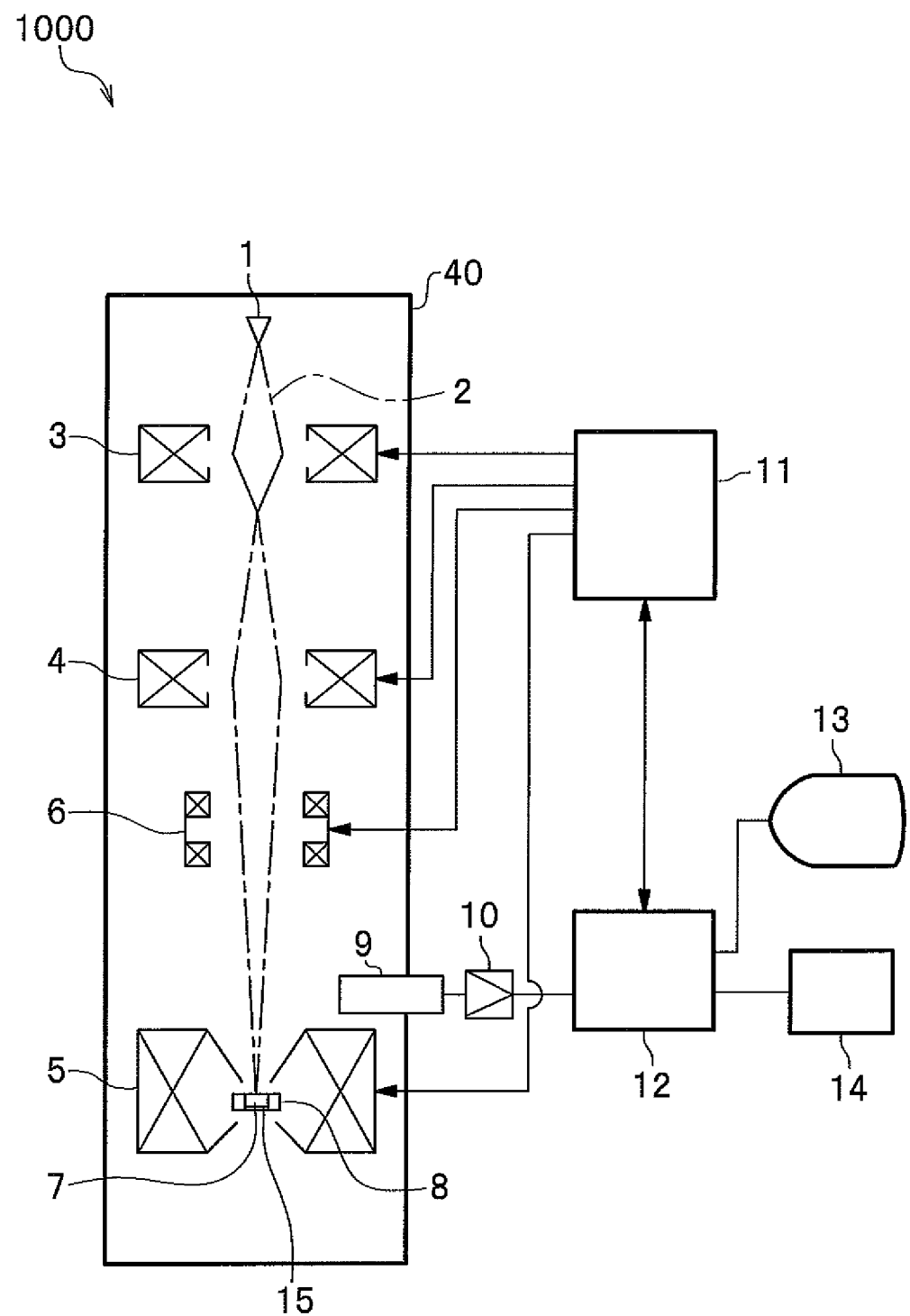
FIG. 1 is a diagram schematically illustrating the configuration of an in-lens SEM according to the embodiment 1.

Hereinbelow, embodiments of the present invention are explained in detail with reference to drawings when necessary. The respective drawings illustrate the present invention only schematically to such an extent that the present invention can be sufficiently understood. Therefore, the present invention is not limited to the illustrated examples. Further, in the drawings, identical or equivalent elements bear identical reference numbers, and the same explanations are not repeated.

Embodiment 1

Configuration of In-Lens SEM

Hereinbelow, the configuration of the in-lens SEM 1000 according to the present embodiment 1 is explained with reference to FIG. 1. FIG. 1 is a diagram schematically illustrating the configuration of the in-lens SEM 1000 according to the embodiment 1.

The in-lens SEM 1000 according to the embodiment 1 is an in-lens type scanning electron microscope to which a specimen holder 15 (explained later) is installed. As illustrated in FIG. 1, the in-lens SEM 1000 includes an electron gun 1, a first condenser lens 3, a second condenser lens 4, an objective lens 5, a deflection coil 6, a specimen stage 8, a detector 9, an amplifier 10, a control unit 11, a processing unit 12, a display unit 13, and an input unit 14.

A specimen under observation 7 is loaded in the specimen holder 15 which is configured for observation of a cross-sectional specimen. (Hereinafter, the specimen under observation may be simply referred to as the specimen.) The specimen holder 15 is fitted to the specimen stage 8, which is arranged in an electron-optical lens-barrel 40 in the in-lens SEM 1000. Thus, the specimen 7 is arranged in a predetermined position inside the electron-optical lens-barrel 40. At this time, the specimen holder 15 holds the specimen 7 in a direction appropriate for observation. Details of the specimen holder 15 are explained later.

In in-lens SEM 1000, the electron gun 1 generates an electron beam 2 as a primary electron beam and emits the electron beam 2 in the direction to the specimen 7. The electron beam 2 emitted from the electron gun 1 is focused through the first condenser lens 3, the second condenser lens 4, and the objective lens 5, and applied to the specimen 7. At this time, the electron beam 2 is biased by the deflection coil 6 such that a surface to be observed (which is hereinafter referred to as the "observation face") of the specimen 7 is scanned by the electron beam 2. Thus, the secondary charged particles are generated at the observation face of the specimen 7 by the irradiation with the electron beam 2, and are then emitted from the specimen 7.

In the in-lens SEM 1000, the secondary charged particles emitted from the specimen 7 are detected by the detector 9, so that an image signal representing the shape of the observation face of the specimen 7 is obtained. The image signal is amplified by the amplifier 10, and converted into a video signal by the processing unit 12. The video signal is displayed by the display unit 13.

When the specimen holder 15 is fitted to the specimen stage 8 in the in-lens SEM 1000, the specimen 7 is arranged in the opening of the objective lens 5 inside the electron-optical lens-barrel 40. In addition, in the in-lens SEM 1000, the control unit 11 controls the operations of the first condenser lens 3, the second condenser lens 4, the objective lens 5, and the specimen stage 8. Further, the processing unit 12 in the in-lens SEM 1000 controls the specimen stage 8 on the basis of information inputted from the input unit 14.

<Structure of Specimen Holder>

The structure of the specimen holder 15 is explained below with reference to FIGS. 2 and 3. In the following explanations, it is assumed that the specimen 7 is a cross-sectional specimen of, for example, a semiconductor wafer. Therefore, hereinafter, the specimen 7 is referred to as "the cross-sectional specimen 7".

Figure 2:
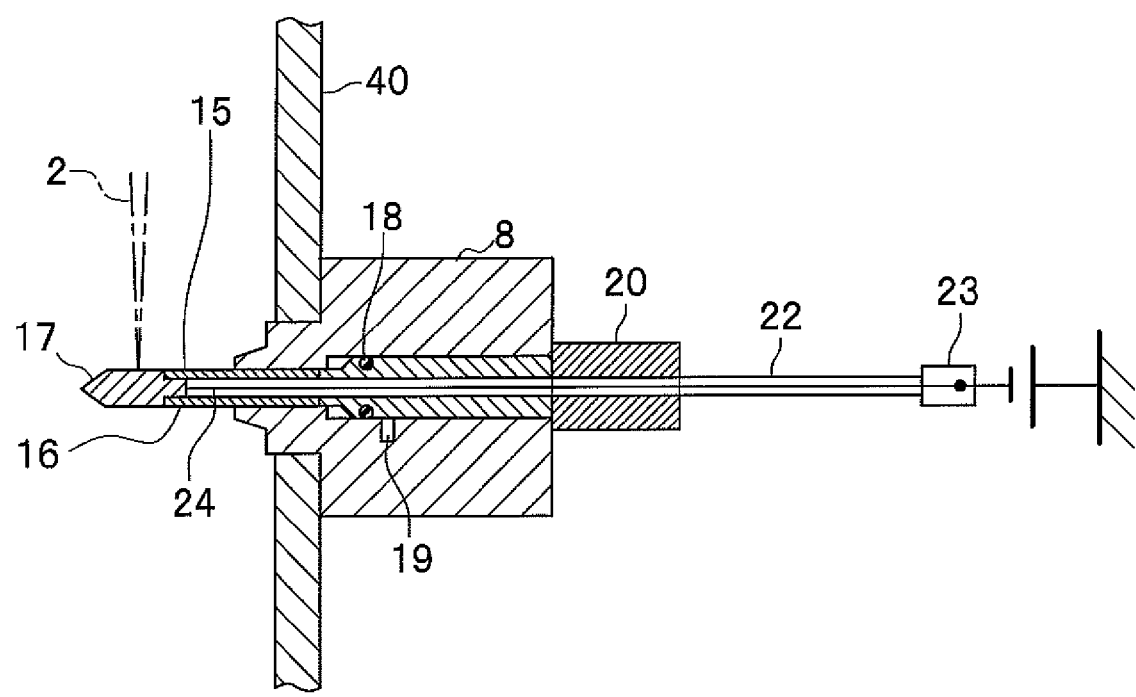
FIG. 2 is a diagram schematically illustrating the structure of a specimen holder according to the embodiment 1.

FIG. 2 is a diagram schematically illustrating the structure of the specimen holder 15 according to the embodiment 1. A state in which the specimen holder 15 is fitted to the specimen stage 8 is illustrated in FIG. 2. FIG. 3 is an exploded perspective view of the specimen holder 15 according to the embodiment 1. In the illustration of FIG. 3, constituent parts of the specimen holder 15 around a specimen mounting portion 17 are dismantled.

As illustrated in FIG. 2, the specimen stage 8 in the in-lens SEM 1000 is arranged at a position in the side wall of the electron-optical lens-barrel 40 in a vicinity of the objective lens 5 (illustrated in FIG. 1) in such a manner that the specimen stage 8 penetrates through the electron-optical lens-barrel 40 from the outside to the inside of the electron-optical lens-barrel 40. A bore (vacuum feedthrough) which makes the inside and the outside of the electron-optical lens-barrel 40 communicate with each other is arranged inside the specimen stage 8. The specimen holder 15 is formed to have a long rod-like shape. The specimen holder 15 is inserted inside the vacuum feedthrough arranged in the specimen stage 8 in such a manner that the tip portion of the specimen holder 15 is inserted into the inside of the electron-optical lens-barrel 40 through the side wall of the electron-optical lens-barrel 40.

The specimen holder 15 includes a body portion 16, a specimen mounting portion 17, an O-ring 18, a guide pin 19, and a grip 20. The body portion 16 is inserted inside the vacuum feedthrough. The cross-sectional specimen 7 is mounted on the specimen mounting portion 17. The O-ring 18 shuts off vacuum. The guide pin 19 functions as a guide for insertion of the specimen holder 15. The grip 20 is provided for manually holding the specimen holder 15. The specimen mounting portion 17 is arranged at the tip end of the body portion 16, and the grip 20 is arranged at the rear end of the body portion 16.

The specimen holder 15 includes a voltage cable 22 and a voltage introduction wire 24.

The voltage cable 22 and the voltage introduction wire 24 constitute the voltage introduction means, which introduces into the specimen mounting portion 17 high voltage applied by the in-lens SEM 1000 through the connector 23.

The voltage cable 22 is arranged to be lead out of the specimen holder 15 through the grip 20. One end of the voltage cable 22 is connected to the voltage introduction wire 24, and the other end of the voltage cable 22 is connected to the connector 23. The voltage introduction wire 24 is arranged inside the body portion 16 and the grip 20. One end of the voltage introduction wire 24 is connected to the specimen mounting portion 17, and the other end of the voltage introduction wire 24 is connected to the voltage cable 22. The in-lens SEM 1000 applies the high voltage to the specimen holder 15 through the connector 23. The applied high voltage is introduced to the specimen mounting portion 17 through the voltage cable 22 and the voltage introduction wire 24. Thus, the applied high voltage acts as the retarding voltage on the electron beam 2.

Figure 3:
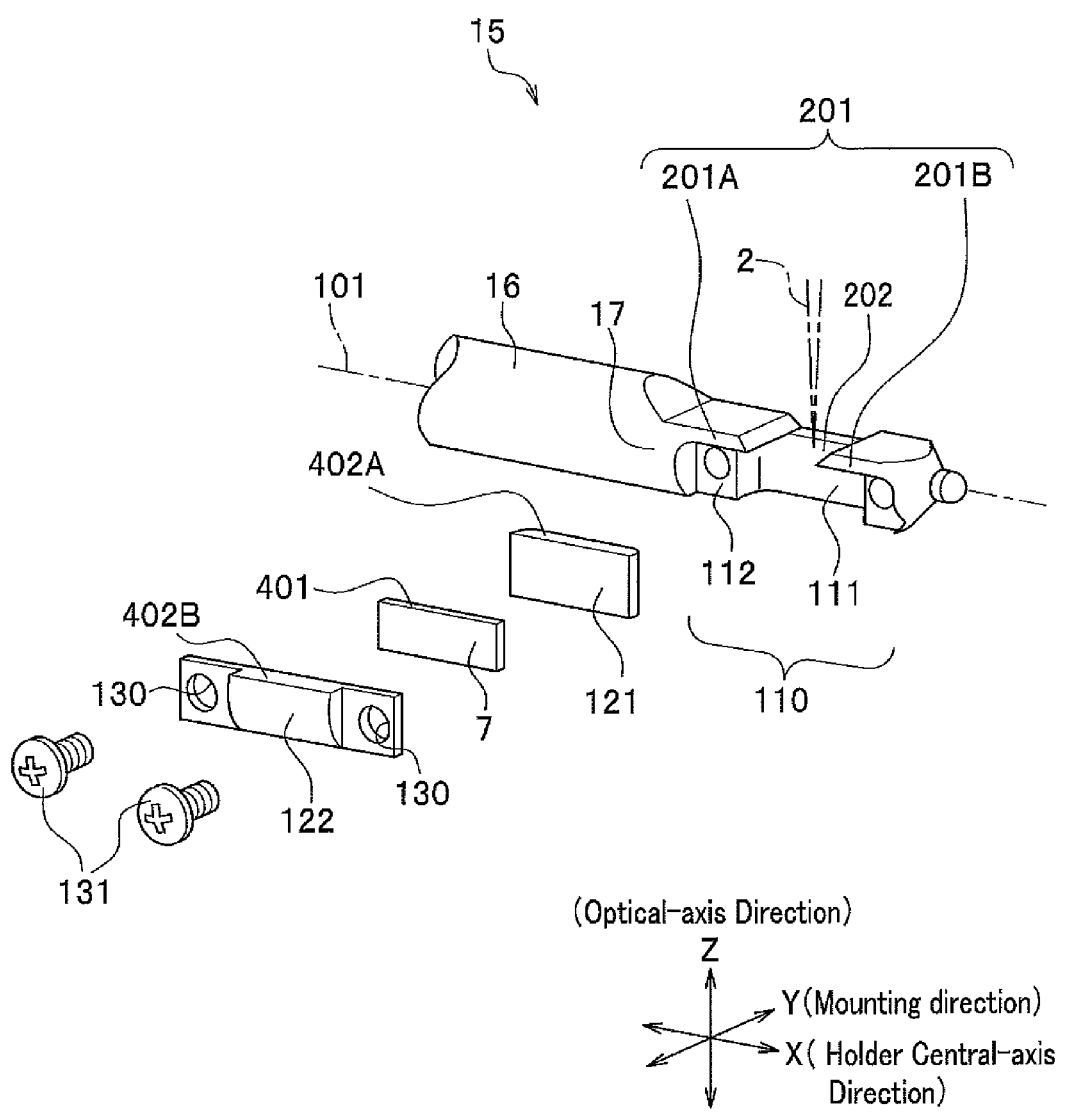
FIG. 3 is an exploded perspective view of the specimen holder according to the embodiment 1.

In addition, the specimen holder 15 includes a first spacer 121 and a second spacer 122 as illustrated in FIG. 3. The first spacer 121 and the second spacer 122 are respectively the first fixing member and the second fixing member, which fix the cross-sectional specimen 7 in such a manner that the cross-sectional specimen 7 is sandwiched between the first and second spacers 121 and 122.

The first and second spacers 121 and 122 are mounted on the specimen mounting portion 17 when the first and second spacers 121 and 122, together with the cross-sectional specimen 7, are mounted inside a mounting hollow 110, which is arranged in the specimen mounting portion 17. The first spacer 121, the cross-sectional specimen 7, and the second spacer 122 are mounted in this order inside the mounting hollow 110 in such a manner that the first spacer 121, the cross-sectional specimen 7, and the second spacer 122 are brought into close contact with each other.

In this specification, the direction in which the central axis 101 of the bar-like specimen holder 15 is referred to as "the holder central-axis direction", the direction in which the first spacer 121, the cross-sectional specimen 7, and the second spacer 122 are mounted is referred to as "the mounting direction". In the following explanations, it is assumed that "the holder central-axis direction", "the optical-axis direction", and "the mounting direction" perpendicularly intersect with each other.

The first spacer 121 is formed to be an elongated planar member. In the first spacer 121, the end face 402A which is arranged to face the electron beam 2 side is formed flat. (Hereinafter, an end face of a spacer is referred to as "a spacer end face".) In addition, the first spacer 121 has two side faces which are formed to be opposed and perpendicularly intersect with the spacer end face 402A.

The two side faces of the first spacer 121 are each formed flat. One of the side faces is an abutting face which abuts (i.e., comes in close contact with) a mounting-direction positioning portion 202. (The mounting-direction positioning portion 202 will be explained later.) The other of the side faces is an abutting face which abuts the cross-sectional specimen 7. Hereinafter, one of the above side faces is referred to as "the first side face", and the other of the above side faces is referred to as "the second side face". Almost the entire area of the first side face excluding both end portions in the holder central-axis direction is formed flat, and only both end portions in the holder central-axis direction are formed to have an arc shape. The entire area of the second side face is formed flat. In addition, almost the entire areas of the first and second side faces excluding both end portions in the holder central-axis direction are formed in parallel.

The second spacer 122 is formed to be an elongated planar member. The second spacer 122 is longer than the first spacer 121 in the holder central-axis direction. In the second spacer 122, the spacer end face 402B is formed flat. In addition, the second spacer 122 has a side face which abuts the cross-sectional specimen 7. Hereinafter, the above side face of the second spacer 122 is referred to as "the specimen abutting face".) The entire area of the specimen abutting face is formed flat. In addition, the specimen abutting face perpendicularly intersects with the spacer end face 402B. When the first spacer 121, the cross-sectional specimen 7, and the second spacer 122 are mounted on the specimen mounting portion 17, the specimen abutting face is arranged to be opposed to the second side face of the first spacer 121 through the cross-sectional specimen 7.

The mounting hollow 110 has a structure which is closed on both sides in the holder central-axis direction, and open on both sides in the optical-axis direction.

Specifically, the mounting hollow 110 has a structure which is open on the side on which the electron beam 2 is injected, and is also open on the opposite side. Hereinafter, the side on which the electron beam 2 is injected is referred to as "the beam incident side", and the opposite side is referred to as "the opposite-to-beam side". In addition, the opening in the mounting hollow 110 which is opened to the beam incident side is referred to as "the opening in the mounting hollow 110 on the beam incident side", and the opening in the mounting hollow 110 which is opened to the opposite-to-beam side is referred to as "the opening in the mounting hollow 110 on the opposite-to-beam side".

In addition, the mounting hollow 110 is formed to be open only on one side in the mounting direction. Hereinafter, the opening in the mounting hollow 110 which is opened in the mounting direction is referred to as "the opening in the mounting hollow 110 opened in the mounting direction", and the inner wall surface of the specimen mounting portion 17 which closes the mounting hollow 110 in the mounting direction is referred to as "the inner wall surface of the specimen mounting portion 17 in the mounting direction". "The inner wall surface of the specimen mounting portion 17 in the mounting direction" corresponds to "the mounting-direction positioning portion 202", which will be explained later.

In the mounting hollow 110, a first hollow 111 in which the first spacer 121 is to be received and a second hollow 112 in which the second spacer 122 is to be received are continuously formed (formed to be connected).

The first hollow 111 is formed to be slightly longer than the first spacer 121 in the holder central-axis direction such that the first spacer 121 can be received in the first hollow 111. In the explanations on the embodiment 1, it is assumed that the cross-sectional specimen 7 is received in the second hollow 112. Therefore, in the embodiment 1, the depth of the first hollow 111 in the mounting direction is set to a value equal to the thickness of the first spacer 121 (i.e., the distance from the aforementioned "first side face" to the aforementioned "second side face" in the first spacer 121), or a value slightly smaller than the above thickness. In addition, the cross-sectional specimen 7 is formed to have a width in the holder central-axis direction which is greater than the width of the first spacer 121 and smaller than the width of the second spacer 122.

In addition, the second hollow 112 has a length in the holder central-axis direction greater than the length of the first hollow 111. Specifically, the length of the second hollow 112 in the holder central-axis direction is slightly greater than the second spacer 122.

As mentioned before, in the explanations on the embodiment 1, it is assumed that the cross-sectional specimen 7 is received in the 112. Alternatively, the specimen holder 15 can be configured such that the cross-sectional specimen 7 is received in the first hollow 111. In this case, the depth of the first hollow 111 in the mounting direction is set to a value slightly greater than the thickness of the first spacer 121 (i.e., the distance from the aforementioned "first side face" to the aforementioned "second side face" in the first spacer 121). In addition, the cross-sectional specimen 7 is formed to have a width in the holder central-axis direction smaller than the width of the first spacer 121. Further, the second spacer 122 is formed such that a portion (abutting the cross-sectional specimen 7) of the aforementioned specimen abutting face (i.e., the side face abutting the cross-sectional specimen 7) protrudes to the first hollow 111 side.

A protruding portion which partially closes the aforementioned "opening in the mounting hollow 110 on the beam incident side (i.e., the opening in the mounting hollow 110 opened on the beam incident side) is arranged in the specimen mounting portion 17. The above protruding portion functions as the optical-axis-direction positioning portion 201, which positions the first spacer 121, the cross-sectional specimen 7, and the second spacer 122 in predetermined positions in the optical-axis direction.

When a planar cross section to be observed 401 of the cross-sectional specimen 7 is referred to as an observation face 401, and the spacer end face 402A of the first spacer 121 to be arranged adjacent to the observation face 401 is referred to as the first flat face 402A, the spacer end face 402B of the second spacer 122 to be arranged adjacent to the observation face 401 is referred to as the second flat face 402B, the optical-axis-direction positioning portion 201 puts the first flat face 402A of the first spacer 121 and the second flat face 402B of the second spacer 122 in the predetermined positions in the optical-axis direction which are parallel with the observation face 401 of the cross-sectional specimen 7 and are equally distant from the observation face 401 in the optical-axis direction.

Further, in the embodiment 1, the spacer end face (first flat face) 402A of the first spacer 121, the observation face 401 of the cross-sectional specimen 7, and the spacer end face (second flat face) 402B of the second spacer 122 are arranged on an identical plane.

In the embodiment 1, the optical-axis-direction positioning portion 201 is constituted by a first optical-axis-direction positioning portion 201A and a second optical-axis-direction positioning portion 201B. The first optical-axis-direction positioning portion 201A is arranged on the rear end side, in the holder central-axis direction, of the opening in the mounting hollow 110 on the beam incident side, and the second optical-axis-direction positioning portion 201B is arranged on the tip end side, in the holder central-axis direction, of the opening in the mounting hollow 110 on the beam incident side.

In addition, the specimen mounting portion 17 has the function of the mounting-direction positioning portion 202, which positions the first spacer 121, the cross-sectional specimen 7, and the second spacer 122 in predetermined positions in the mounting direction by making the aforementioned "inner wall surface of the specimen mounting portion 17 in the mounting direction" among the inner wall surfaces surrounding the first hollow 111 abut the aforementioned "first side face" of the first spacer 121.

In the specimen holder 15, the first spacer 121, the cross-sectional specimen 7, and the second spacer 122 are mounted in this order inside the mounting hollow 110 in the specimen holder 15 from the aforementioned "opening in the mounting hollow 110 in the mounting direction" or from the aforementioned "opening in the mounting hollow 110 on the opposite-to-beam side" in such a manner that the first spacer 121, the cross-sectional specimen 7, and the second spacer 122 are in close contact with each other. At this time, the first spacer 121 is received in the first hollow 111, and the cross-sectional specimen 7 and the second spacer 122 are received in the second hollow 112.

Drilled bores 130 for allowing penetration of screws 131 are arranged in vicinities of both ends of the second spacer 122 in the holder central-axis direction. The screws 131 are fitted through the drilled bores 130 in the second spacer 122 into female screws arranged inside the second hollow 112 in the specimen mounting portion 17, and fastened. Therefore, the screws 131 press the first spacer 121, the cross-sectional specimen 7, and the second spacer 122 against the mounting-direction positioning portion 202 (which is arranged inside the mounting hollow 110 in the specimen mounting portion 17). Thus, the first spacer 121, the cross-sectional specimen 7, and the second spacer 122 are fixed to the specimen mounting portion 17 in the specimen holder 15.

<Method of Fixing Cross-Sectional Specimen to Specimen Holder>

Figure 4A:
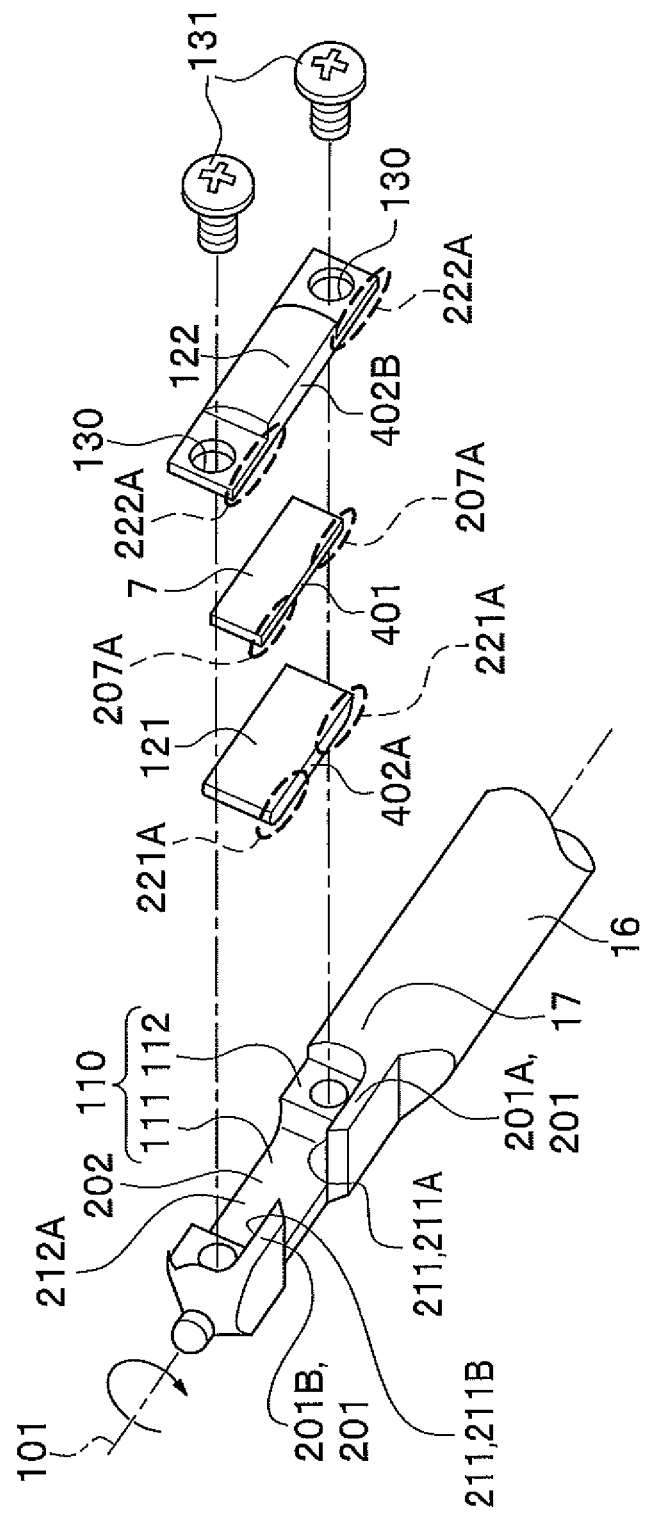
FIG. 4A is an explanatory diagram (1) illustrating a method of fixing a cross-sectional specimen to the specimen holder according to the embodiment 1.
Figure 4B:
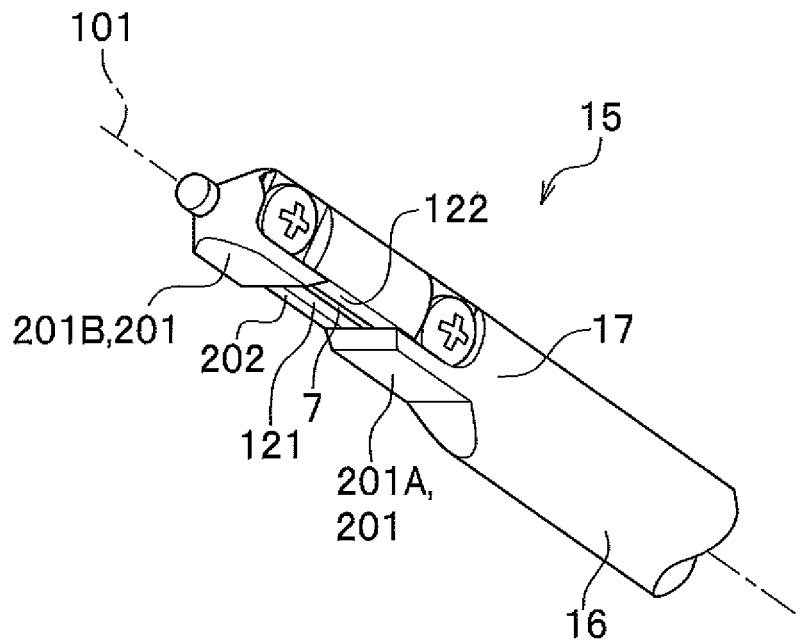
FIG. 4B is an explanatory diagram (2) illustrating the method of fixing a cross-sectional specimen to the specimen holder according to the embodiment 1.
Figure 4C:
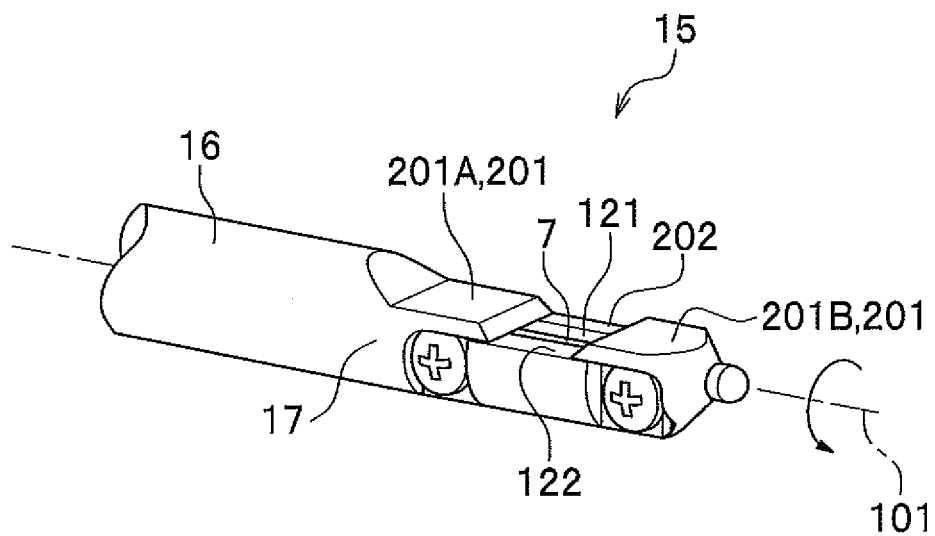
FIG. 4C is an explanatory diagram (3) illustrating the method of fixing a cross-sectional specimen to the specimen holder according to the embodiment 1.

Hereinbelow, a method of fixing the cross-sectional specimen 7 to the specimen holder 15 is explained with reference to FIGS. 4A to 4C. FIGS. 4A and 4B are rear views of the structure of the specimen holder 15 illustrated in FIG. 3. FIG. 4C is a view, from the same side, of the structure of the specimen holder 15 illustrated in FIG. 3

For example, as illustrated in FIG. 4A, the specimen holder 15 is rotated around the central axis 101. As a result, the specimen holder 15 becomes upside down. At this time, the inner wall surface 211 facing the mounting hollow 110 in the optical-axis-direction positioning portion 201 is turned upward.

The first spacer 121 and the second spacer 122 are placed on the inner wall surface 211 of the optical-axis-direction positioning portion 201. At this time, the first spacer 121, the cross-sectional specimen 7, and the second spacer 122 comes to abut (into contact with) the inner wall surface 211 of the optical-axis-direction positioning portion 201 under their own weight. As a result, both end portions of the spacer end face 402A of the first spacer 121 (which are hereinafter referred to as "the abutting portions 221A"), both end portions of the observation face 401 of the cross-sectional specimen 7 (which are hereinafter referred to as "the abutting portions 207A"), and both end portions of the spacer end face 402B of the second spacer 122 (which are hereinafter referred to as "the abutting portions 222A") abut the inner wall surface 211 of the optical-axis-direction positioning portion 201. At this time, the inner wall surface 211 of the optical-axis-direction positioning portion 201 positions the first spacer 121, the cross-sectional specimen 7, and the second spacer 122 in the predetermined positions in the optical-axis direction.

Hereinafter, the inner wall surface 211 of the optical-axis-direction positioning portion 201 is referred to as the "optical-axis-direction positioning face 211". In addition, in order to distinguish between the inner wall surface 211 of the first optical-axis-direction positioning portion 201A and the inner wall surface 211 of the second optical-axis-direction positioning portion 201B, the inner wall surface 211 of the first optical-axis-direction positioning portion 201A is referred to as the "optical-axis-direction positioning face 211A", and the inner wall surface 211 of the second optical-axis-direction positioning portion 201B is referred to as the "optical-axis-direction positioning face 211B". The optical-axis-direction positioning face 211A and the optical-axis-direction positioning face 211B are arranged on the identical plane.

In addition, as mentioned before, according to the embodiment 1, the "predetermined positions in the optical-axis direction" are the positions in which the spacer end face (first flat face) 402A of the first spacer 121, the observation face 401 of the cross-sectional specimen 7, and the spacer end face (second flat face) 402B of the second spacer 122 are arranged on the identical plane.

The first spacer 121, the cross-sectional specimen 7, and the second spacer 122 are placed on the optical-axis-direction positioning face 211 of the optical-axis-direction positioning portion 201 of the specimen holder 15, and the screws 131 are fitted through the drilled bores 130 in the second spacer 122 into the female screws arranged inside the second hollow 112 in the specimen mounting portion 17, and fastened. Thus, the specimen holder 15 is assembled as illustrated in FIG. 4B. That is, the first spacer 121, the cross-sectional specimen 7, and the second spacer 122 are fixed to the specimen mounting portion 17.

After the first spacer 121, the cross-sectional specimen 7, and the second spacer 122 are fixed to the specimen mounting portion 17 of the specimen holder 15, the specimen holder 15 is rotated around the central axis 101. As a result, the specimen holder 15 returns from the upside down position to the original position, as illustrated in FIG. 4C.

<Structure of Specimen Mounting Portion in Specimen Holder>

Figure 5A:
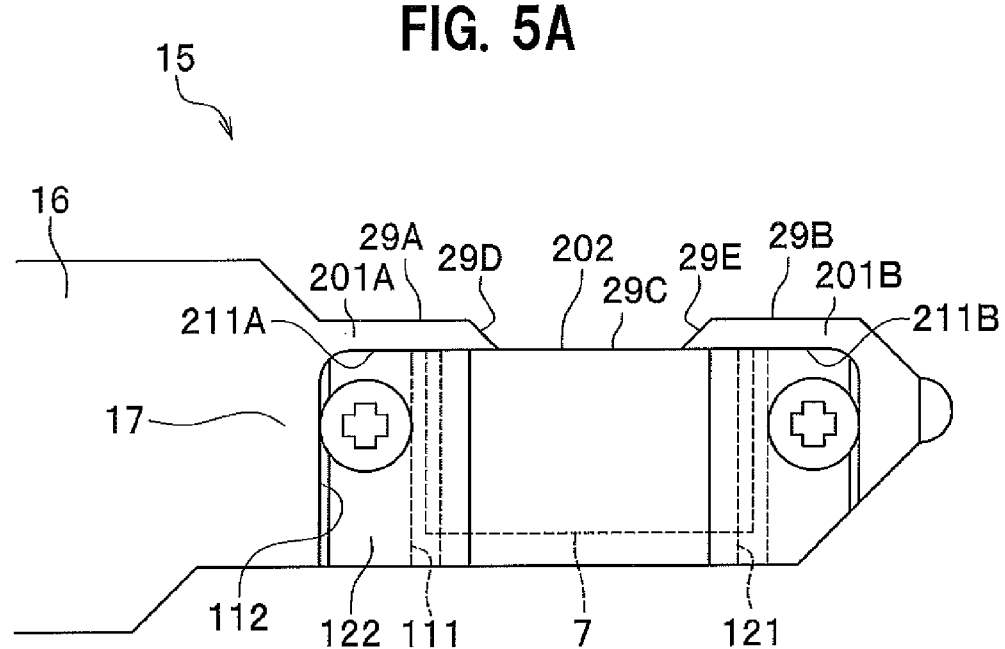
FIG. 5A is a front view of a specimen mounting portion of the specimen holder according to the embodiment 1.
Figure 5B:
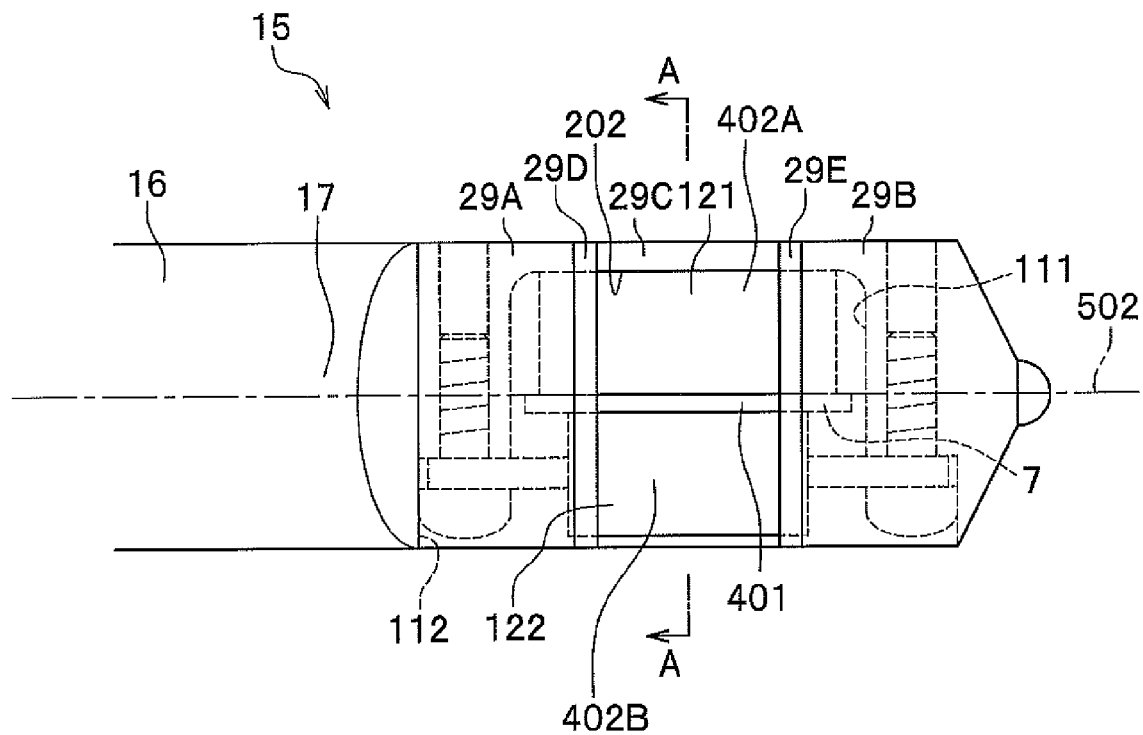
FIG. 5B is a top view of the specimen mounting portion of the specimen holder according to the embodiment 1.
Figure 5C:
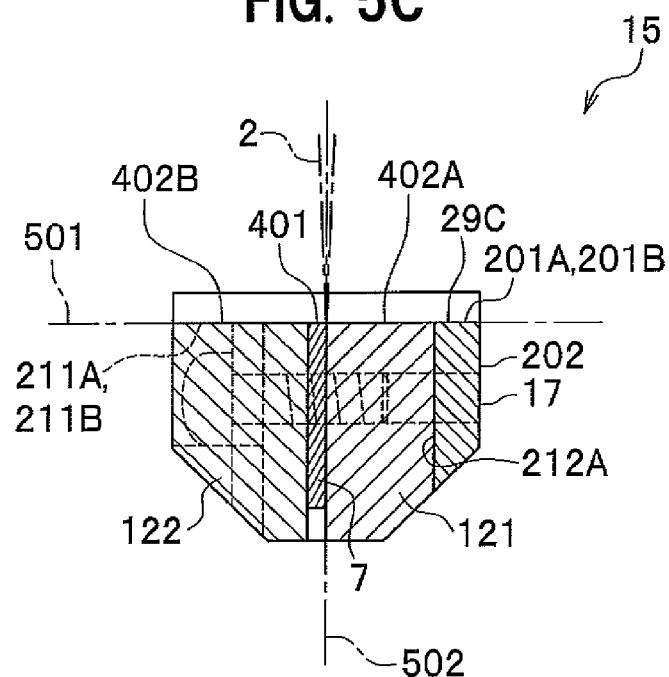
FIG. 5C is a cross-sectional view of the specimen mounting portion of the specimen holder according to the embodiment 1.

Hereinbelow, the structure of the specimen mounting portion 17 in the specimen holder 15 is explained with reference to FIGS. 5A to 5C. FIG. 5A is a front view of the specimen mounting portion 17 of the specimen holder 15 according to the embodiment 1, FIG. 5B is a top view of the specimen mounting portion 17 of the specimen holder 15 according to the embodiment 1, and FIG. 5C is a cross-sectional view of the specimen mounting portion 17 of the specimen holder 15 according to the embodiment 1. Each of FIGS. 5A to 5C illustrates the state in which the cross-sectional specimen 7 is loaded in the specimen holder 15 (i.e., the state in which the first spacer 121, the cross-sectional specimen 7, and the second spacer 122 are mounted on the specimen mounting portion 17 in the specimen holder 15).

As illustrated in FIGS. 5A and 5B, in the specimen mounting portion 17 in the specimen holder 15, the face on the beam incident side of the first optical-axis-direction positioning portion 201A is formed flat, and the face on the beam incident side of the second optical-axis-direction positioning portion 201B is also formed flat. Hereinafter, the face on the beam incident side of the first optical-axis-direction positioning portion 201A is referred to as "the flat face 29A", and the face on the beam incident side of the second optical-axis-direction positioning portion 201B is referred to as "the flat face 29B".

In addition, in the specimen mounting portion 17 in the specimen holder 15, the face on the beam incident side of the portion connecting the first optical-axis-direction positioning portion 201A and the second optical-axis-direction positioning portion 201B is formed flat. Hereinafter, the face on the beam incident side connecting the first optical-axis-direction positioning portion 201A and the second optical-axis-direction positioning portion 201B is referred to as "the flat face 29C". In particular, in order to distinguish the flat face 29C from the flat face 29A and the flat face 29B, the flat face 29C is referred to as "the central flat face 29C", the flat face 29A is referred to as "the side flat face 29A", and the flat face 29B is referred to as "the side flat face 29B". The central flat face 29C is arranged on the same plane as the optical-axis-direction positioning face 211A of the first optical-axis-direction positioning portion 201A and the optical-axis-direction positioning face 211B of the second optical-axis-direction positioning portion 201B.

Further, in the specimen mounting portion 17 in the specimen holder 15, a portion connecting the central flat face 29C and the side flat face 29A is formed to have an inclined flat face, and a portion connecting the central flat face 29C and the side flat face 29B is also formed to have an inclined flat face. Hereinafter, the face on the portion connecting the central flat face 29C and the side flat face 29A is referred to as "the inclined face 29D", and the face on the portion connecting the central flat face 29C and the side flat face 29B is referred to as "the inclined face 29E".

As illustrated in FIGS. 5A and 5B, the first hollow 111 and the second hollow 112 are opened on both sides in the optical-axis direction, and opened on only one side in the mounting direction. In addition, in the first hollow 111 and the second hollow 112, the aforementioned "opening in the mounting hollow 110 on the beam incident side" is partially closed by the first optical-axis-direction positioning portion 201A and the second optical-axis-direction positioning portion 201B. That is, although the first hollow 111 and the second hollow 112 constitute a through-hole in the beam incident direction in the region corresponding to the central flat face 29C, the first hollow 111 and the second hollow 112 do not constitute a through-hole in the beam incident direction in the other regions (i.e., in the regions corresponding to the side flat face 29A, the inclined face 29D, the inclined face 29E, and the side flat face 29B).

When the first spacer 121, the cross-sectional specimen 7, and the second spacer 122 are mounted on the specimen mounting portion 17, the optical-axis-direction positioning faces 211A and 211B of the first optical-axis-direction positioning portion 201A and the second optical-axis-direction positioning portion 201B constitute bottom faces of the first hollow 111 and the second hollow 112 (as illustrated in FIG. 4), and the first spacer 121, the cross-sectional specimen 7, and the second spacer 122 are mounted on the optical-axis-direction positioning faces 211A and 211B. Thus, as illustrated in FIG. 5A, both end portions, in the holder central-axis direction, of the first spacer 121, the cross-sectional specimen 7, and the second spacer 122 abut the optical-axis-direction positioning faces 211A and 211B.

The first spacer 121, the cross-sectional specimen 7, and the second spacer 122 are placed on the optical-axis-direction positioning faces 211A and 211B of the optical-axis-direction positioning portions 201A and 201B of the specimen holder 15, and the screws 131 are fitted through the drilled bores 130 in the second spacer 122 into the female screws arranged inside the second hollow 112 in the specimen mounting portion 17, and fastened. Thus, the specimen holder 15 is assembled as illustrated in FIG. 4B. That is, the first spacer 121, the cross-sectional specimen 7, and the second spacer 122 are fixed to the specimen mounting portion 17.

At this time, the first spacer 121 abuts the mounting-direction positioning portion 202 in the specimen mounting portion 17. Therefore, the first spacer 121, the cross-sectional specimen 7, and the second spacer 122 are positioned in the predetermined positions in the mounting direction according to the thicknesses of the respective members (i.e., the first spacer 121, the cross-sectional specimen 7, and the second spacer 122) as illustrated in FIGS. 5B and 5C. FIG. 5C is a cross-sectional view of the specimen mounting portion 17 at the cross section indicated by the line A-A in FIG. 5B.

When the first spacer 121, the cross-sectional specimen 7, and the second spacer 122 are mounted on the specimen mounting portion 17, finally, details of the assembly become as follows.

As illustrated in FIGS. 5A and 5C, both end portions (specifically, the abutting portions 221A as illustrated in FIG. 4A), in the holder central-axis direction, of the spacer flat face 402A of the first spacer 121 abut the optical-axis-direction positioning faces 211A and 211B of the optical-axis-direction positioning portions 201A and 201B. Therefore, in the above arrangement, the spacer flat face 402A of the first spacer 121 is necessarily arranged on the same plane as the central flat face 29C of the specimen mounting portion 17.

In addition, both end portions (specifically, the abutting portions 207A as illustrated in FIG. 4A), in the holder central-axis direction, of the observation face 401 of the cross-sectional specimen 7 abut the optical-axis-direction positioning faces 211A and 211B of the optical-axis-direction positioning portions 201A and 201B. Therefore, in the above arrangement, the observation face 401 of the cross-sectional specimen 7 is necessarily arranged on the same plane as the central flat face 29C of the specimen mounting portion 17.

Further, both end portions (specifically, the abutting portions 222A as illustrated in FIG. 4A), in the holder central-axis direction, of the second flat face 402B of the second spacer 122 abut the optical-axis-direction positioning faces 211A and 211B of the optical-axis-direction positioning portions 201A and 201B. Therefore, in the above arrangement, the second flat face 402B of the second spacer 122 is necessarily arranged on the same plane as the central flat face 29C of the specimen mounting portion 17.

As a result, in the above arrangement of the specimen holder 15, the first flat face 402A of the first spacer 121, the observation face 401 of the cross-sectional specimen 7, and the second flat face 402B of the second spacer 122 are arranged on the identical plane.

In addition, in the embodiment 1, as illustrated in FIGS. 5B and 5C, the plane on which a side face of the first spacer 121 and a side face of the cross-sectional specimen 7 are in close contact with each other is on a plane which contains the optical axis of the electron beam 2 and the central axis 101 (illustrated in FIG. 3) of the body portion 16 of the specimen holder 15. Hereinafter, the plane containing the optical axis of the electron beam 2 and the central axis 101 of the body portion 16 of the specimen holder 15 is referred to as "the vertical reference plane 502".

In addition, in the specimen holder 15 according to the embodiment 1, as illustrated in FIG. 5C, the central flat face 29C of the specimen mounting portion 17 and the optical-axis-direction positioning faces 211A and 211B of the optical-axis-direction positioning portions 201A and 201B are arranged on the identical plane. Hereinafter, the plane on which the central flat face 29C of the specimen mounting portion 17 and the optical-axis-direction positioning faces 211A and 211B of the optical-axis-direction positioning portions 201A and 201B are arranged is referred to as "the optical-axis-direction reference plane 501". The optical-axis-direction reference plane 501 perpendicularly intersects with the vertical reference plane 502.

<Equipotential Distribution Around Specimen Mounting Portion of Specimen Holder>

Figure 6:
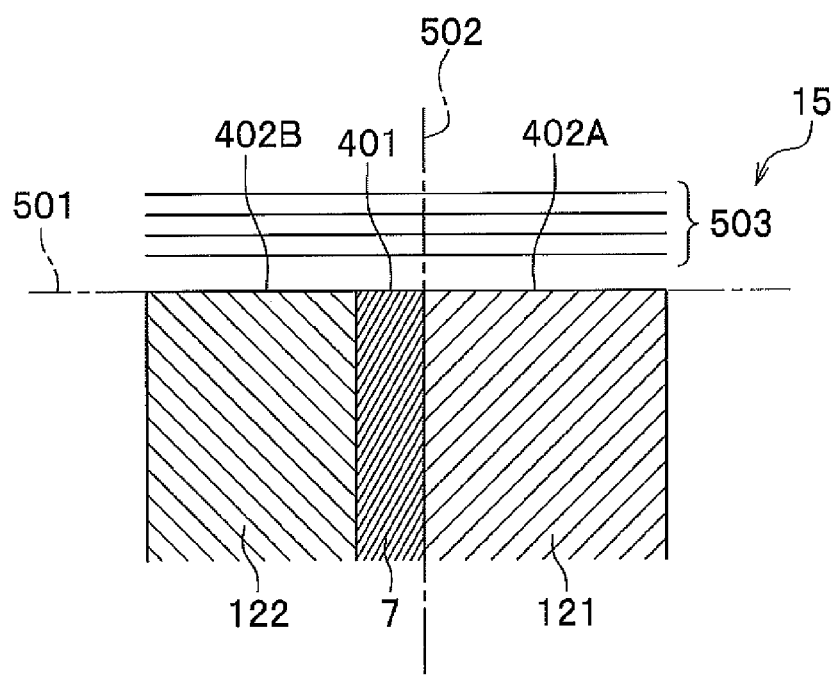
FIG. 6 is a diagram indicating an equipotential distribution around the specimen mounting portion of the specimen holder according to the embodiment 1.

FIG. 6 is a diagram indicating an equipotential distribution around the specimen mounting portion 17 of the specimen holder 15 according to the embodiment 1. Specifically, FIG. 6 indicates an example of an equipotential distribution around the specimen mounting portion 17 when the first spacer 121, the cross-sectional specimen 7, and the second spacer 122 are mounted on the specimen mounting portion 17 in the specimen holder 15 and a retarding voltage is applied to the specimen mounting portion 17.

As illustrated in FIG. 6, the equipotential lines 503 around the specimen mounting portion 17 of the specimen holder 15 are uniform over the first flat face 402A of the first spacer 121, the observation face 401 of the cross-sectional specimen 7, and the second flat face 402B of the second spacer 122. That is, the retarding electric field around the observation face 401 of the cross-sectional specimen 7 is made uniform by arranging on the identical plane the observation face 401 of the cross-sectional specimen 7, the first flat face 402A of the first spacer 121, and the second flat face 402B of the second spacer 122.

In the specimen holder 15 as above, the specimen mounting portion 17 holds the cross-sectional specimen 7 in a direction appropriate for observation, and the retarding voltage is introduced to the specimen mounting portion 17 through the voltage cable 22 and the voltage introduction wire 24, which function as the voltage introduction means. Therefore, the specimen holder 15 can easy realize observation of the cross-sectional specimen 7 by the retarding method in the electron microscope.

Further, neither a protrusion nor a recess causing irregularity is formed in the specimen holder 15 around the observation face 401 of the cross-sectional specimen 7. Therefore, in the specimen holder 15, the equipotential lines 503 become uniform over the observation face 401 of the cross-sectional specimen 7, the first flat face 402A of the first spacer 121, and the second flat face 402B of the second spacer 122.

The above specimen holder 15 can suppress to the minimum the occurrence of the phenomena such as unevenness of brightness, image deformation, and deterioration of resolution in observation of the cross-sectional specimen 7 by the retarding method in the electron microscope. Therefore, the specimen holder 15 enables satisfactory observation of the cross-sectional specimen 7 by the retarding method in the electron microscope. In particular, when the specimen holder 15 as above is applied to the in-lens type electron microscope (in-lens SEM), the specimen holder 15 can achieve a remarkable advantage.

As explained above, the specimen holder 15 according to the embodiment 1 enables satisfactory observation of the cross-sectional specimen 7 by the retarding method in the electron microscope.

Embodiment 2

In the specimen holder 15 according to the embodiment 1, the retarding electric field around the observation face 401 of cross-sectional specimen 7 is made uniform by arranging on the identical plane the observation face 401 of the cross-sectional specimen 7, the first flat face 402A of the first spacer 121, and the second flat face 402B of the first spacer 121.

However, in the specimen holder 15 in the embodiment 1, some cases in which the retarding electric field around the observation face 401 of cross-sectional specimen 7 cannot be made completely uniform can be considered to occur according to the material of the cross-sectional specimen 7.

For example, in the case where the material of the cross-sectional specimen 7 is different from the material of the first spacer 121 and the second spacer 122 in the specimen holder 15 in the embodiment 1, the dielectric constants as the values of a physical property are respectively different. Therefore, a difference can occur between the electric potential gradient in the cross-sectional specimen 7 and the electric potential gradients in the first spacer 121 and the second spacer 122. As a result, a difference in the electric potential occurs between the observation face 401 of the cross-sectional specimen 7, the first flat face 402A of the first spacer 121, and the second flat face 402B of the second spacer 122 in the specimen holder 15 in the embodiment 1.

Therefore, in the specimen holder 15 in the embodiment 1, the retarding electric field around the observation face 401 of cross-sectional specimen 7 depends on a difference in the materials between the cross-sectional specimen 7 and the first spacer 121 and the second spacer 122, so that the equipotential lines 503 over the observation face 401 of the cross-sectional specimen 7, the first flat face 402A of the first spacer 121, and the second flat face 402B of the second spacer 122 may become uniform or nonuniform.

In view of above, a specimen holder 15B provided in the embodiment 2 makes the equipotential lines 503 uniform in the situation in which the equipotential lines 503 around the observation face 401 of the cross-sectional specimen 7 become nonuniform because of the material of the cross-sectional specimen 7.

Figure 7A:
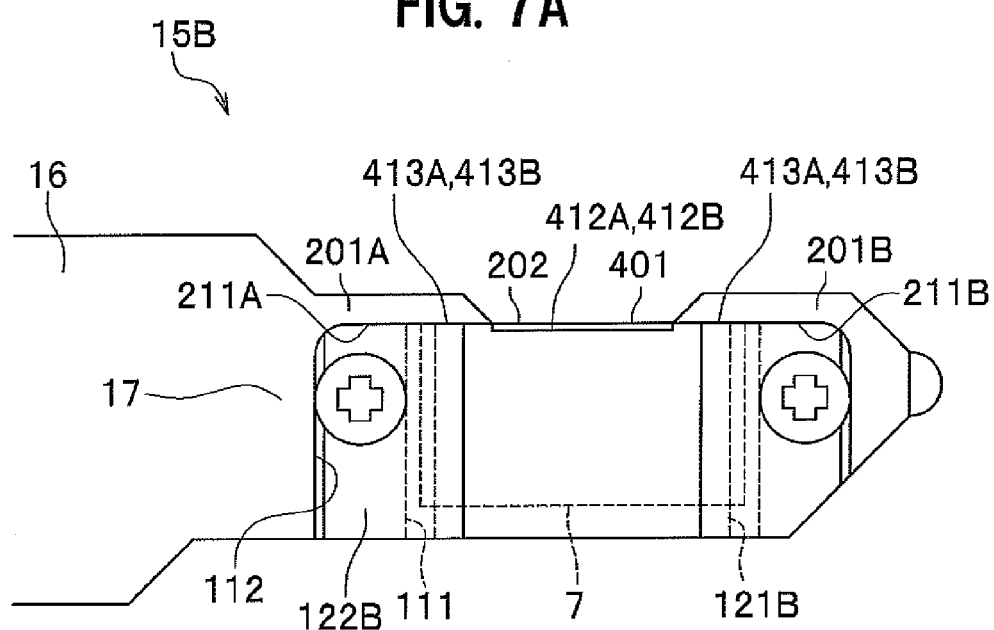
FIG. 7A is a front view of a specimen mounting portion of a specimen holder according to the embodiment 2.
Figure 7B:
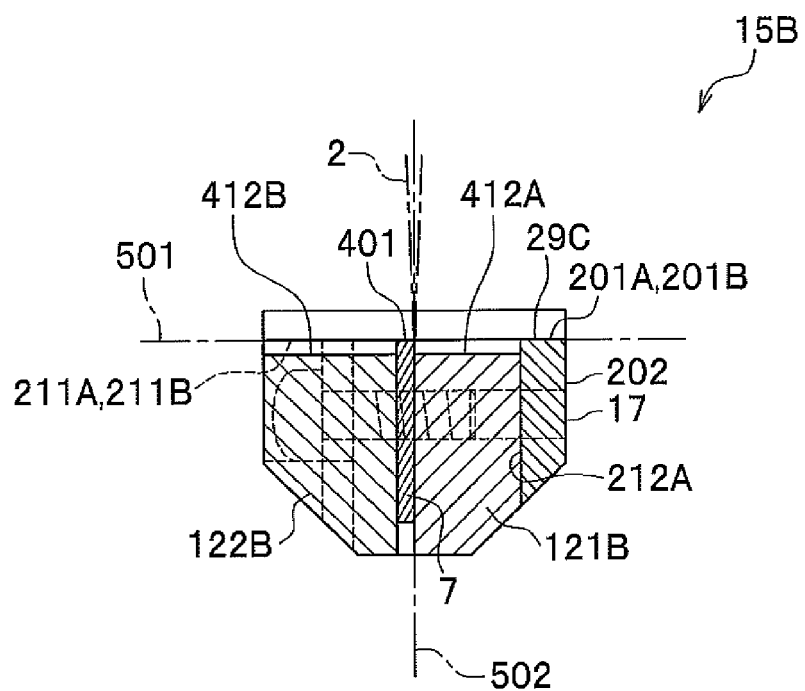
FIG. 7B is a cross-sectional view of the specimen mounting portion of the specimen holder according to the embodiment 2.

Hereinbelow, the structure of the specimen holder 15B according to the embodiment 2 is explained with reference to FIGS. 7A and 7B. FIG. 7A is a front view of a specimen mounting portion 17 of the specimen holder 15B according to the embodiment 2, and FIG. 7B is a cross-sectional view of the specimen mounting portion 17 of the specimen holder 15B according to the embodiment 2. FIGS. 7A and 7B each illustrate a state in which a first spacer 121B, the cross-sectional specimen 7, and a second spacer 122B are inserted into the specimen mounting portion 17 of the specimen holder 15B.

In the following explanations, it is assumed that the dielectric constant of the material of the cross-sectional specimen 7 to be observed is smaller than the dielectric constant of the material of the first spacer 121B and the second spacer 122B which are used in the embodiment 2. Specifically, it is assumed that the cross-sectional specimen 7 is a semiconductor wafer of Si, and the material of the first spacer 121B and the second spacer 122B which are used in the embodiment 2 is phosphor bronze.

The specimen holder 15B according to the embodiment 2 is different from the specimen holder 15 according to the embodiment 1 in that the first spacer 121B and the second spacer 122B are used instead of the first spacer 121 and the second spacer 122 used in the specimen holder 15 according to the embodiment 1.

As illustrated in FIG. 7A and FIG. 7B, the first spacer 121B has a first flat face 412A in a central portion of a face on the beam incident side, and third flat faces 413A on both sides of the first flat face 412A, where the elevation of the third flat faces 413A is higher than the first flat face 412A by a desired amount. The third flat faces 413A are portions which abut the optical-axis-direction positioning faces 211A and 211B of the optical-axis-direction positioning portions 201A and 201B of the specimen mounting portion 17 when the first spacer 121B is mounted on the specimen mounting portion 17. Similarly, the second spacer 122B has a second flat face 412B in a central portion of a face on the beam incident side, and fourth flat faces 413B on both sides of the second flat face 412B, where the elevation of the fourth flat faces 413B is higher than the second flat face 412B by a desired amount. The fourth flat faces 413B are portions which abut the optical-axis-direction positioning faces 211A and 211B of the optical-axis-direction positioning portions 201A and 201B of the specimen mounting portion 17 when the second spacer 122B is mounted on the specimen mounting portion 17. In this explanation, it is assumed that the "desired amount" between the first flat face 412A and the third flat faces 413A is equal to the "desired amount" between the second flat face 412B and the fourth flat faces 413B.

In the example illustrated in FIG. 7A, the first flat face 412A of the first spacer 121B and the second flat face 412B of the second spacer 122B are formed to have a length in the central-axis direction which is equal to the length of the central flat face 29C of the specimen mounting portion 17. However, the first flat face 412A and the second flat face 412B may be formed to have a length in the central-axis direction which is greater or smaller than the length of the central flat face 29C according to the application.

As illustrated in FIG. 7A, when the first spacer 121B is mounted on the specimen mounting portion 17, the third flat faces 413A of the first spacer 121B abut the optical-axis-direction positioning faces 211A and 211B of the optical-axis-direction positioning portion 201A and 201B, and the first flat face 412A of the first spacer 121B does not abut the optical-axis-direction positioning faces 211A and 211B of the optical-axis-direction positioning portion 201A and 201B. At this time, as illustrated in FIG. 7B, the first flat face 412A of the first spacer 121B is arranged on a plane different from the central flat face 29C of the specimen mounting portion 17 (i.e., a plane different from the optical-axis-direction reference plane 501). In addition, as illustrated in FIG. 7A, when the second spacer 122B is mounted on the specimen mounting portion 17, the fourth flat faces 413B of the second spacer 122B abut the optical-axis-direction positioning faces 211A and 211B of the optical-axis-direction positioning portion 201A and 201B, and the second flat face 412B of the second spacer 122B does not abut the optical-axis-direction positioning faces 211A and 211B of the optical-axis-direction positioning portion 201A and 201B. At this time, as illustrated in FIG. 7B, the second flat face 412B of the second spacer 122B is arranged on a plane different from the central flat face 29C of the specimen mounting portion 17 (i.e., a plane different from the optical-axis-direction reference plane 501).

On the other hand, as illustrated in FIG. 7A, when the cross-sectional specimen 7 is mounted on the specimen mounting portion 17, the observation face 401 of the cross-sectional specimen 7 abuts the optical-axis-direction positioning faces 211A and 211B of the optical-axis-direction positioning portions 201A and 201B of the specimen mounting portion 17. Therefore, as illustrated in FIG. 7B, the observation face 401 of the cross-sectional specimen 7 is necessarily arranged on the same plane as the central flat face 29C (i.e., the optical-axis-direction reference plane 501).

Therefore, in the specimen holder 15B, the first flat face 412A of the first spacer 121B and the second flat face 412B of the second spacer 122B can be positioned at an elevation lower than the observation face 401 of the cross-sectional specimen 7 by a desired amount of step down.

Figure 8A:
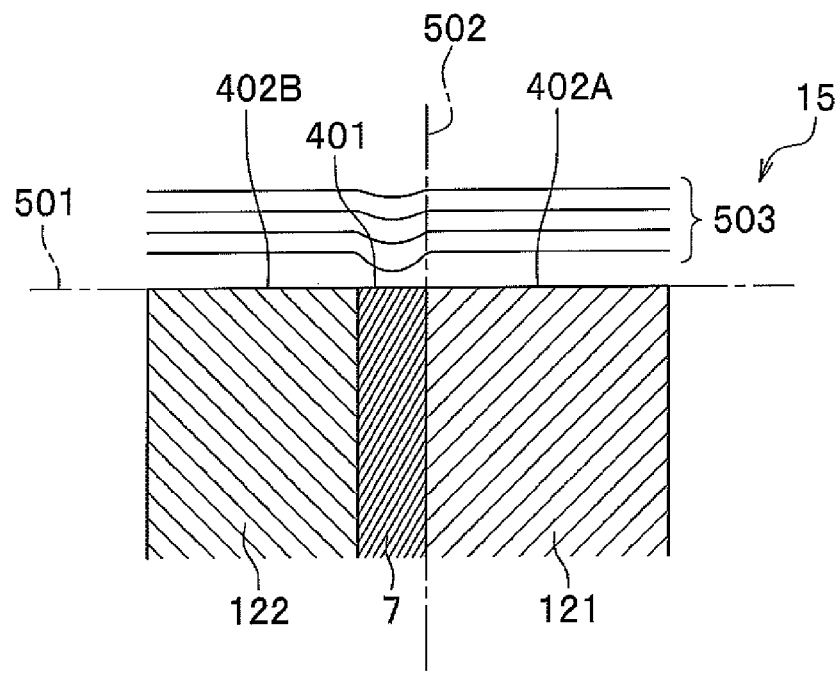
FIG. 8A is a diagram indicating an equipotential distribution around a specimen mounting portion of a specimen holder as a comparison example.

FIG. 8A is a diagram indicating an equipotential distribution around the specimen mounting portion of a specimen holder as a comparison example. FIG. 8A shows an example of an equipotential distribution around the specimen mounting portion 17 when the first spacer 121, the cross-sectional specimen 7, and the second spacer 122 are mounted on the specimen mounting portion 17 of the specimen holder 15 according to the embodiment 1, and the retarding voltage is applied to the specimen mounting portion 17. The comparison example is explained on the assumption that the cross-sectional specimen 7 is a semiconductor wafer of Si, and the material of the first spacer 121 and the second spacer 122 is phosphor bronze.

Figure 8B:
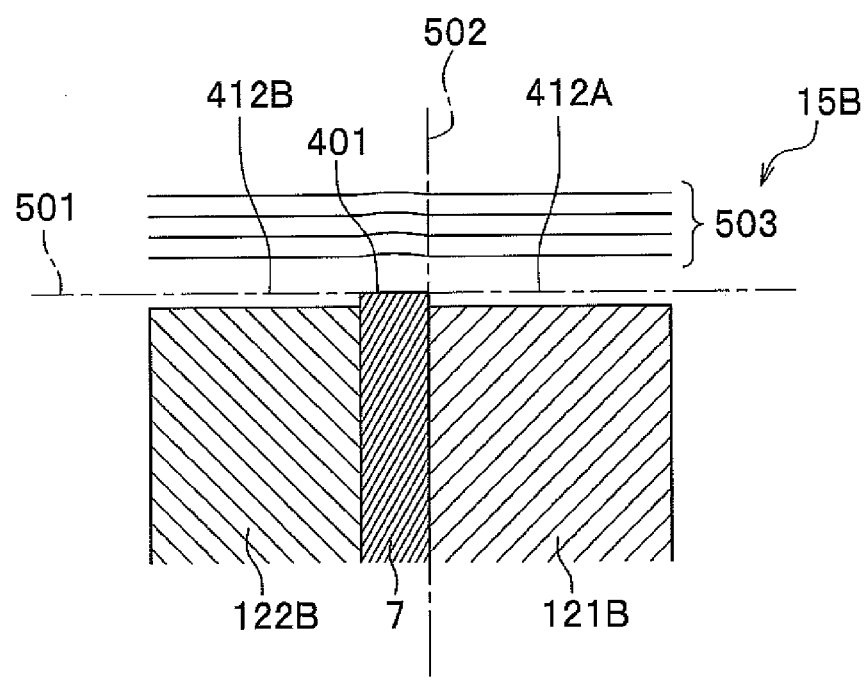
FIG. 8B is a diagram indicating an equipotential distribution around the specimen mounting portion of the specimen holder according to the embodiment 2.

In addition, FIG. 8B is a diagram indicating an equipotential distribution around the specimen mounting portion 17 of the specimen holder 15B according to the embodiment 2. FIG. 8B shows an example of an equipotential distribution around the specimen mounting portion 17 when the first spacer 121B, the cross-sectional specimen 7, and the second spacer 122B are mounted on the specimen mounting portion 17 of the specimen holder 15B according to the embodiment 2, and the retarding voltage is applied to the specimen mounting portion 17.

The specimen holder 15 according to the comparison example positions on the identical plane the observation face 401 of the cross-sectional specimen 7, the first flat face 402A of the first spacer 121B and the second flat face 402B of the second spacer 122B. In the specimen holder 15 according to the comparison example, both of the first spacer 121 and the second spacer 122 are formed of phosphor bronze. Therefore, as illustrated in FIG. 8A, the equipotential lines 503 over the first flat face 402A of the first spacer 121 and the equipotential lines 503 over the second flat face 402B of the second spacer 122 become uniform as illustrated in FIG. 8A.

However, in the specimen holder 15 according to the comparison example, the cross-sectional specimen 7 is formed of Si. Therefore, the equipotential lines 503 over the observation face 401 are lowered compared with the equipotential lines 503 over the first flat face 402A of the first spacer 121 and the equipotential lines 503 over the second flat face 402B of the second spacer 122. This is because the dielectric constant of Si, of which the cross-sectional specimen 7 is formed, is smaller than the dielectric constant of phosphor bronze, of which the first spacer 121 and the second spacer 122 are formed, so that a difference occurs between the electric potential gradient inside the cross-sectional specimen 7 and the electric potential gradients inside the first spacer 121 and the second spacer 122.

On the other hand, in the specimen holder 15B according to the embodiment 2, the first flat face 412A of the first spacer 121B and the second flat face 412B of the second spacer 122B are positioned at an elevation lower than the observation face 401 of the cross-sectional specimen 7 by the desired amount of step down.

Therefore, in the specimen holder 15B according to the embodiment 2, a very small protrusion or recess is formed around the observation face 401 of the cross-sectional specimen 7, and a nonuniform retarding electric field is caused by the protrusion or recess. Thus, in the specimen holder 15B according to the embodiment 2, the nonuniform retarding electric field caused by the protrusion or recess and the nonuniform retarding electric field caused by the difference between the electric potential gradient inside the cross-sectional specimen 7 and the electric potential gradients inside the first spacer 121B and the second spacer 122B are canceled out.

Thus, in the specimen holder 15B according to the embodiment 2 as above, as illustrated in FIG. 8B, the equipotential lines 503 can be made uniform over the entire area including the observation face 401 of the cross-sectional specimen 7, the first flat face 412A of the second spacer 122B, and the second flat face 412B of the second spacer 122B.

In other words, the specimen holder 15B according to the embodiment 2 can generate, around the observation face 401 of the cross-sectional specimen 7, a uniform retarding electric field which does not depend on the difference in the material between the cross-sectional specimen 7 and the first spacer 121B and the second spacer 122B.

As a result, even when the material of the cross-sectional specimen 7 is different from the material of the first spacer 121B and the second spacer 122B in the specimen holder 15B according to the embodiment 2, the specimen holder 15B according to the embodiment 2 can suppress to the minimum the occurrence of the phenomena such as unevenness of brightness, image deformation, and deterioration of resolution, and enables satisfactory observation of the cross-sectional specimen 7 by the retarding method in the electron microscope (in particular, the in-lens SEM 1000).

Incidentally, in the explanations on the embodiment 2, it is assumed that the material of the cross-sectional specimen 7 is Si, and the material of the first spacer 121B and the second spacer 122B is phosphor bronze. However, these materials are selected merely for ease of explanation on of the embodiment 2. The material of the cross-sectional specimen 7 and the materials of the first spacer 121B and the second spacer 122B are not limited to the mentioned materials as long as the dielectric constant of the cross-sectional specimen 7 is smaller than the dielectric constant of the first spacer 121B and the second spacer 122B.

In addition, in the specimen holder 15B according to the embodiment 2, it is possible to consider occurrence of a case in which the difference between the electric potential gradient inside the cross-sectional specimen 7 and the electric potential gradients inside the first spacer 121B and the second spacer 122B becomes too great. If, in the above case, the elevation of the first flat face 412A and the second flat face 412B is lower than the elevation of the third flat faces 413A and the fourth flat faces 413B by a desired amount appropriate for the above difference, the retarding electric field in the specimen holder 15B according to the embodiment 2 concentrates to the protrusion or recess formed around the cross-sectional specimen 7, and the intensity of the retarding electric field in the specimen holder 15B according to the embodiment 2 becomes too high. Therefore, it is possible to consider that, in the above case, the nonuniform retarding electric field caused by the protrusion or recess and the nonuniform retarding electric field caused by the difference between the electric potential gradient inside the cross-sectional specimen 7 and the electric potential gradients inside the first spacer 121B and the second spacer 122B cannot be satisfactorily canceled out, and therefore the retarding electric field around the observation face 401 of the cross-sectional specimen 7 cannot be made uniform. As a result, in the above case, the specimen holder 15B according to the embodiment 2 causes the phenomena such as unevenness of brightness, image deformation, and deterioration of resolution.

Nevertheless, the specimen holder 15B according to the embodiment 2 can cope with even the above case by replacement of the first spacer 121B and the second spacer 122B, for example, by changing the material of the first spacer 121B and the second spacer 122B to a semiconductor having a smaller dielectric constant. Even in such a case, the material of the first spacer 121B and the second spacer 122B is not limited to the mentioned material.

Further, the aforementioned "desired amount" between the elevations of the first flat face 412A and the third flat faces 413A of the first spacer 121B and the aforementioned "desired amount" between the elevations of the second flat face 412B and the fourth flat faces 413B of the second spacer 122B are such amounts that the nonuniform retarding electric field caused by the materials is canceled out. In addition, the desired amounts of the elevations vary with the observation conditions. That is, the desired amounts of the elevations are not constant values. Therefore, for the specimen holder 15B according to the embodiment 2, it is necessary to provide multiple types of the first spacer 121B and the second spacer 122B producing various amounts of steps (distances) between the first flat face 412A and the third flat faces 413A and between the second flat face 412B and the fourth flat faces 413B such that the various amounts of steps are respectively suitable for users' observation conditions. However, since the aforementioned "desired amounts" are actually on the order of several micrometers, the multiple types of the first spacer 121 and the second spacer 122 which are provided for the specimen holder 15B in the embodiment 2 are not so many as tens or hundreds of types.

As explained above, the specimen holder 15B according to the embodiment 2 enables satisfactory observation of the cross-sectional specimen 7 by the retarding method in the electron microscope, similarly to the specimen holder 15 according to the embodiment 1.

Further, the specimen holder 15B according to the embodiment 2 is different from the specimen holder 15 according to the embodiment 1 in that even when the material of the cross-sectional specimen 7 is different from the material of the first spacer 121B and the second spacer 122B, the specimen holder 15B according to the embodiment 2 can suppress to the minimum the occurrence of the phenomena such as unevenness of brightness, image deformation, and deterioration of resolution, and enables satisfactory observation of the cross-sectional specimen 7 by the retarding method in the electron microscope.

Embodiment 3

In the specimen holder 15B according to the embodiment 2, the dielectric constant of the material of the cross-sectional specimen 7 to be observed is smaller than the dielectric constant of the material of the first spacer 121B and the second spacer 122B.

In contrast, in the specimen holder 15C according to the embodiment 3, the dielectric constant of the material of the cross-sectional specimen 7 to be observed is greater than the dielectric constant of the material of the first spacer 121B and the second spacer 122B.

Figure 9A:
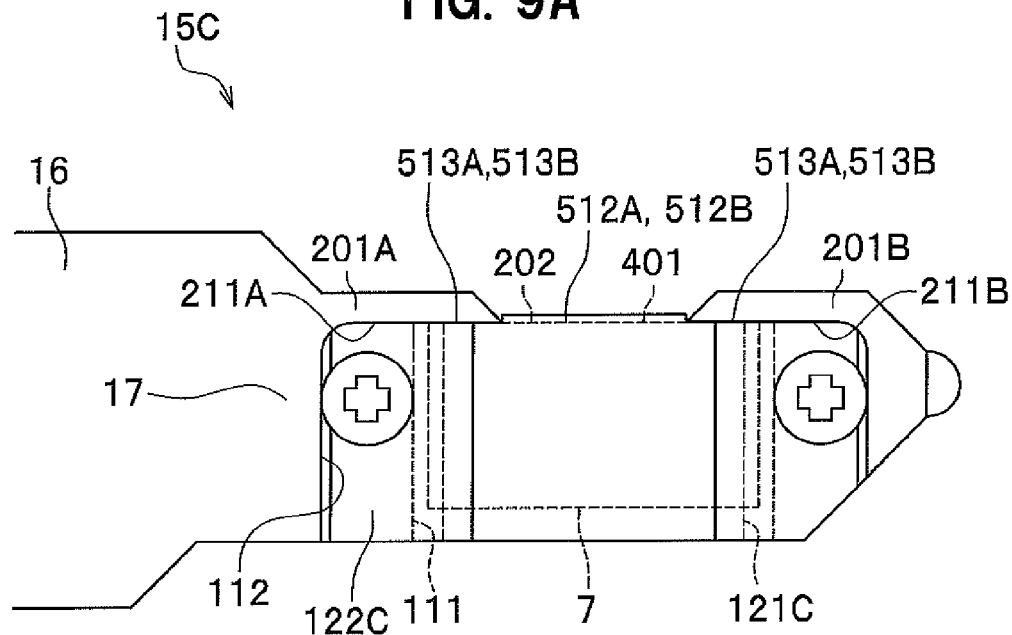
FIG. 9A is a front view of a specimen mounting portion of a specimen holder according to the embodiment 3.
Figure 9B:
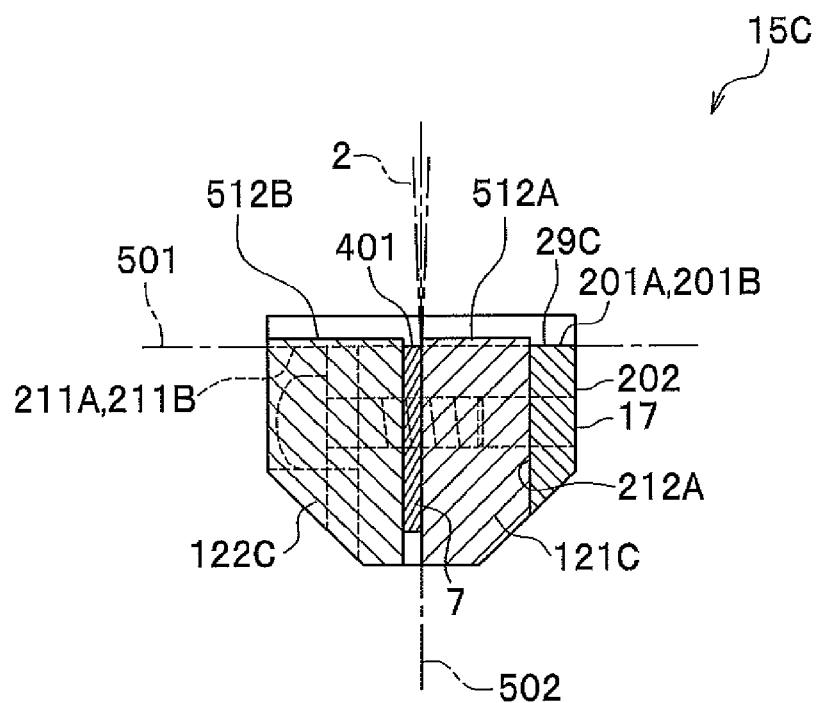
FIG. 9B is a cross-sectional view of the specimen mounting portion of the specimen holder according to the embodiment 3.

Hereinbelow, the specimen holder 15C according to the embodiment 3 is explained with reference to FIGS. 9A and 9B. FIG. 9A is a front view of the specimen mounting portion 17 of the specimen holder 15C according to the embodiment 3, and FIG. 9B is a cross-sectional view of the specimen mounting portion 17 of the specimen holder 15C according to the embodiment 3. FIGS. 9A and 9B each show a configuration in which the first spacer 121C, the cross-sectional specimen 7, and the second spacer 122C are inserted into the specimen mounting portion 17 in the specimen holder 15C.

The specimen holder 15C according to the embodiment 3 is different from the specimen holder 15B according to the embodiment 2 in that the first spacer 121C and the second spacer 122C are used instead of the first spacer 121B and the second spacer 122B used in the specimen holder 15B according to the embodiment 2.

As illustrated in FIG. 9A and FIG. 9B, the first spacer 121C has a first flat face 512A in a central portion of a face on the beam incident side, and third flat faces 513A on both sides of the first flat face 512A, where the elevation of the third flat faces 513A is lower than the first flat face 512A by a desired amount. The third flat faces 513A are portions which abut the optical-axis-direction positioning faces 211A and 211B of the optical-axis-direction positioning portions 201A and 201B of the specimen mounting portion 17 when the first spacer 121C is mounted on the specimen mounting portion 17. Similarly, the second spacer 122C has a second flat face 512B in a central portion of a face on the beam incident side, and fourth flat faces 513B on both sides of the second flat face 512B, where the elevation of the fourth flat faces 513B is lower than the second flat face 512B by a desired amount. The fourth flat faces 513B are portions which abut the optical-axis-direction positioning faces 211A and 211B of the optical-axis-direction positioning portions 201A and 201B of the specimen mounting portion 17 when the second spacer 122C is mounted on the specimen mounting portion 17. In this explanation, it is assumed that the "desired amount" between the first flat face 512A and the third flat faces 513A is equal to the "desired amount" between the second flat face 512B and the fourth flat faces 513B.

In the example illustrated in FIG. 9A, the first flat face 512A of the first spacer 121C and the second flat face 512B of second spacer 122C are formed to have a length in the central-axis direction which is slightly smaller than the length of the central flat face 29C of the specimen mounting portion 17. Therefore, as illustrated in FIG. 9A, when the first spacer 121C is mounted on the specimen mounting portion 17, the third flat faces 513A of the first spacer 121C abut the optical-axis-direction positioning faces 211A and 211B of the optical-axis-direction positioning portion 201A and 201B, and the first flat face 512A of the first spacer 121C does not abut the optical-axis-direction positioning faces 211A and 211B of the optical-axis-direction positioning portion 201A and 201B. At this time, as illustrated in FIG. 9B, the first flat face 512A of the first spacer 121C is arranged on a plane different from the central flat face 29C of the specimen mounting portion 17 (i.e., a plane different from the optical-axis-direction reference plane 501). In addition, as illustrated in FIG. 9A, when the second spacer 122C is mounted on the specimen mounting portion 17, the fourth flat faces 513B of the second spacer 122C abut the optical-axis-direction positioning faces 211A and 211B of the optical-axis-direction positioning portion 201A and 201B, and the second flat face 512B of the second spacer 122C does not abut the optical-axis-direction positioning faces 211A and 211B of the optical-axis-direction positioning portion 201A and 201B. At this time, as illustrated in FIG. 9B, the second flat face 512B of the second spacer 122C is arranged on a plane different from the central flat face 29C of the specimen mounting portion 17 (i.e., a plane different from the optical-axis-direction reference plane 501). Further, as illustrated in FIG. 9A, when the second spacer 122C is mounted on the specimen mounting portion 17, the fourth flat faces 513B of the second spacer 122C abut the optical-axis-direction positioning faces 211A and 211B of the optical-axis-direction positioning portion 201A and 201B, and the first flat face 512A of the second spacer 122C does not abut the optical-axis-direction positioning faces 211A and 211B of the optical-axis-direction positioning portion 201A and 201B. At this time, as illustrated in FIG. 9B, the second flat face 512B of the second spacer 122C is arranged on a plane different from the central flat face 29C of the specimen mounting portion 17 (i.e., a plane different from the optical-axis-direction reference plane 501).

On the other hand, as illustrated in FIG. 9A, when the cross-sectional specimen 7 is mounted on the specimen mounting portion 17, the observation face 401 abuts the optical-axis-direction positioning faces 211A and 211B of the optical-axis-direction positioning portions 201A and 201B. Therefore, as illustrated in FIG. 9B, the observation face 401 of the cross-sectional specimen 7 is necessarily arranged on the same plane as the central flat face 29C of the specimen mounting portion 17 (i.e., on the optical-axis-direction reference plane 501).

Thus, the specimen holder 15C can position the first flat face 512A of the first spacer 121C and the second flat face 512B of the second spacer 122C at an elevation higher than the observation face 401 of the cross-sectional specimen 7 by a desired amount of step.

Figure 10:
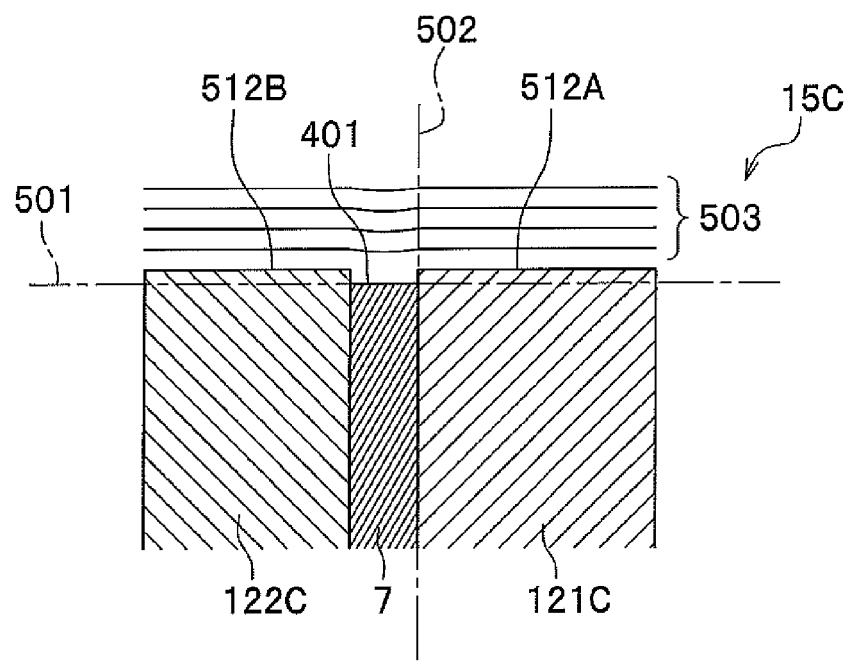
FIG. 10 is a diagram indicating an equipotential distribution around the specimen mounting portion of the specimen holder according to the embodiment 3.

FIG. 10 is a diagram indicating an equipotential distribution around the specimen mounting portion 17 of the specimen holder 15C according to the embodiment 3. FIG. 10 shows an example of an equipotential distribution around the specimen mounting portion 17 when the first spacer 121C, the cross-sectional specimen 7, and the second spacer 122C are mounted on the specimen mounting portion 17 of the specimen holder 15C according to the embodiment 2, and the retarding voltage is applied to the specimen mounting portion 17.

The specimen holder 15C according to the embodiment 3 positions the first flat face 512A of the first spacer 121C and the second flat face 512B of the second spacer 122C at an elevation higher than the observation face 401 of the cross-sectional specimen 7 by a desired amount of step.

Therefore, in the specimen holder 15C according to the embodiment 3, a very small protrusion or recess is formed around the observation face 401 of the cross-sectional specimen 7, and a nonuniform retarding electric field is caused by the protrusion or recess. Thus, in the specimen holder 15C according to the embodiment 3, the nonuniform retarding electric field caused by the protrusion or recess and the nonuniform retarding electric field caused by the difference between the electric potential gradient inside the cross-sectional specimen 7 and the electric potential gradients inside the first spacer 121C and the second spacer 122C are canceled out.

Thus, in the specimen holder 15C according to the embodiment 3 as above, as illustrated in FIG. 10, the equipotential lines 503 can be made uniform over the entire area including the observation face 401 of the cross-sectional specimen 7, the first flat face 512A of the second spacer 122C, and the second flat face 512B of the second spacer 122C.

In other words, similarly to the specimen holder 15B according to the embodiment 2, the specimen holder 15C according to the embodiment 3 can generate, around the observation face 401 of the cross-sectional specimen 7, a uniform retarding electric field which does not depend on the difference in the material between the cross-sectional specimen 7 and the first spacer 121C and the second spacer 122C.

As a result, similarly to the specimen holder 15B according to the embodiment 2, even when the material of the cross-sectional specimen 7 is different from the material of the first spacer 121C and the second spacer 122C in the specimen holder 15C according to the embodiment 3, the specimen holder 15C according to the embodiment 3 can suppress to the minimum the occurrence of the phenomena such as unevenness of brightness, image deformation, and deterioration of resolution, and enables satisfactory observation of the cross-sectional specimen 7 by the retarding method in the electron microscope (in particular, the in-lens SEM 1000).

As explained above, similarly to the specimen holder 15B according to the embodiment 2, the specimen holder 15C according to the embodiment 3 enables satisfactory observation of the cross-sectional specimen 7 by the retarding method in the electron microscope.

Further, similarly to the specimen holder 15B according to the embodiment 2, even when the material of the cross-sectional specimen 7 is different from the material of the first spacer 121C and the second spacer 122C, the specimen holder 15C according to the embodiment 3 can suppress to the minimum the occurrence of the phenomena such as unevenness of brightness, image deformation, and deterioration of resolution, and enables satisfactory observation of the cross-sectional specimen 7 by the retarding method in the electron microscope.

Embodiment 4

In the specimen holder 15B according to the embodiment 2, the amount of step (distance) between the first flat face 412A and the third flat faces 413A and the amount of step (distance) between the second flat face 412B and the fourth flat faces 413B are, for example, on the order of several micrometers. Therefore, it can be considered that whether and to what degree the first flat face 412A of the first spacer 121B is higher or lower than the third flat faces 413A of the first spacer 121B and whether and to what degree the third flat faces 413A of the second spacer 122B is higher or lower than the fourth flat faces 413B of the second spacer 122B are indeterminable by appearance with the naked eye. This is also the case in the specimen holder 15C according to the embodiment 3.

Therefore, in the specimen holder 15B according to the embodiment 2 and the specimen holder 15C according to the embodiment 3, it can be considered that the observer cannot select the first spacer 121B and the second spacer 122B which are appropriate for the observation condition or the first spacer 121C and the second spacer 122C which are appropriate for the observation condition.

In addition, in the specimen holder 15B according to the embodiment 2 and the specimen holder 15C according to the embodiment 3, the case in which what is used as the material of the first spacer 121B and the second spacer 122B is not known can be considered to occur.

In view of above, according to the embodiment 4, a specimen holder 15D using a first spacer 121D and a second spacer 122D is provided. Attribute information including the value which indicates the amount of step (distance) between the first flat face 412A and the third flat faces 413A (or between the second flat face 412B and the fourth flat faces 413B) and the material of the first spacer 121D and the second spacer 122D is indicated on the first spacer 121D and the second spacer 122D.

Figure 11:
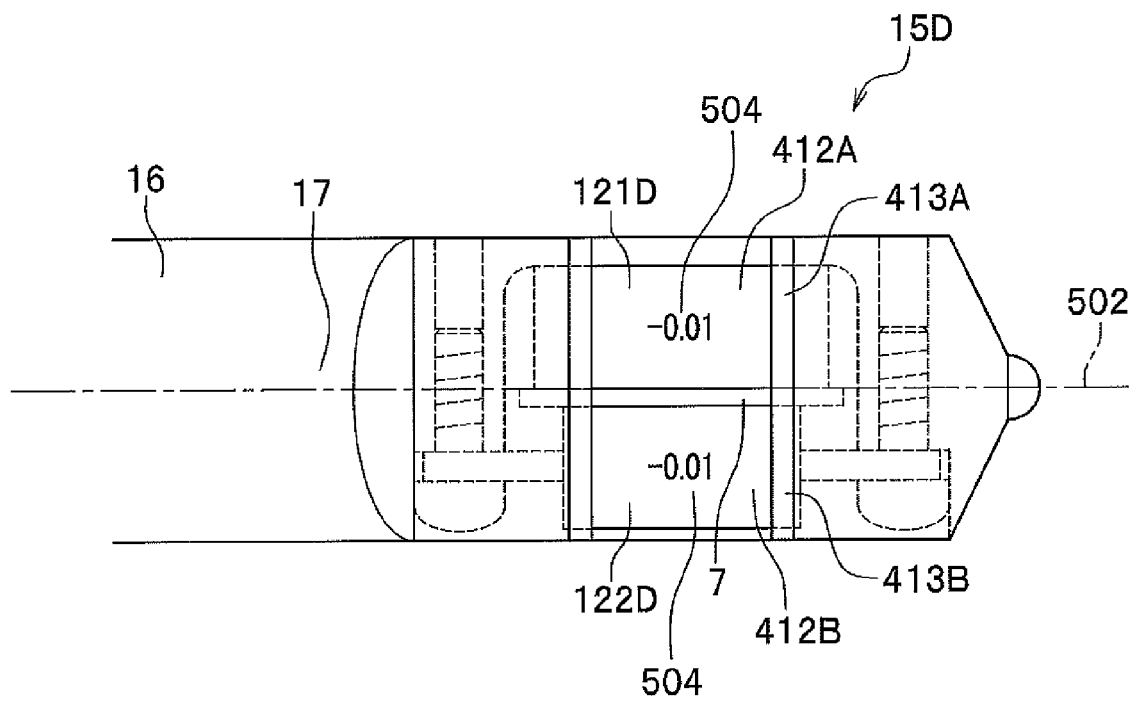
FIG. 11 is a top view of first and second spacers used in a specimen holder according to the embodiment 4.

Hereinbelow, the specimen holder 15D according to the embodiment 4 is explained with reference to FIG. 11. FIG. 11 is a top view of the first spacer 121D and the second spacer 122D used in the specimen holder 15D according to the embodiment 4.

The specimen holder 15D according to the embodiment 4 is different from the first spacer 121B and the second spacer 122B according to the embodiment 2 and the specimen holder 15C according to the embodiment 3 in that the first spacer 121D and the second spacer 122D are used instead of the first spacer 121B and the second spacer 122B used in the specimen holder 15B according to the embodiment 2 or the first spacer 121C and the second spacer 122C used in the specimen holder 15C according to the embodiment 3.

The first spacer 121D and the second spacer 122D used in the embodiment 4 are different from the first spacer 121B the second spacer 122B used in the embodiment 2 or the first spacer 121C and the second spacer 122C used in the embodiment 3 in that impressions or engravings indicating the values of the amount of step (distance) between the first flat face 412A and the third flat faces 413A and the amount of step (distance) between the second flat face 412B and the fourth flat faces 413B are formed as marks 504 on the respectively corresponding ones of the first spacer 121D and the second spacer 122D.

Although, in the example to show in FIG. 11, the marks 504 indicating the values of the amount of step (distance) between the first flat face 412A and the third flat faces 413A and the amount of step (distance) between the second flat face 412B and the fourth flat faces 413B are formed on the respectively corresponding ones of the first spacer 121D and the second spacer 122D, the material of the first spacer 121D and the second spacer 122D, as well as the values of the amounts of steps, may also be included in the marks 504 formed on the first spacer 121D and the second spacer 122D.

The manner of forming the marks 504 is not limited to impressions or engravings. For example, the marks 504 may be formed by coloring or shaping which enables identification of the attribute information. The manner of forming the marks 504 is not specifically limited as long as the observer can correctly select the first spacer 121D and the second spacer 122D which are appropriate for each condition.

As explained above, similarly to the specimen holders 15, 15B, and 15C according to the embodiments 1 to 3, the specimen holder 15D according to the embodiment 4 enables satisfactory observation of the cross-sectional specimen 7 by the retarding method in the electron microscope.

Further, similarly to the specimen holder 15B according to the embodiment 2 and the specimen holder 15C according to the embodiment 3, even when the material of the cross-sectional specimen 7 is different from the material of the first spacer 121D and the second spacer 122D, the specimen holder 15D according to the embodiment 4 can suppress to the minimum the occurrence of the phenomena such as unevenness of brightness, image deformation, and deterioration of resolution, and enables satisfactory observation of the cross-sectional specimen 7 by the retarding method in the electron microscope.

Further, the specimen holder 15D according to the embodiment 4 is different from the first spacer 121B and the second spacer 122B according to the embodiment 2 and the specimen holder 15C according to the embodiment 3 in that the first spacer 121D and the second spacer 122D, on which the attribute information is indicated, are used, so that the observer can select an appropriate set of the first spacer 121D and the second spacer 122D.

The present invention is not limited to the embodiments explained above, and includes various variations. For example, the above embodiments are explained in detail for ease of understanding the present invention. Therefore, the present invention is not limited to the configuration having all the explained constituents. In addition, part of the constituents of each embodiment may be replaced with other element(s), or added to the configuration of another of the explained embodiments. Further, part of the constituents of each embodiment may be deleted. In particular, part of the constituents of each embodiment may be replaced with part of another embodiment, or may be added to the configuration of another embodiment.

LIST OF REFERENCES

1: Electron Gun
2: Electron Beam
3: First Condenser lens
4: Second Condenser lens
5: Objective Lens
6: Deflection Coil
7: Specimen to be Observed (Cross-sectional Specimen)
8: Specimen Stage
9: Detector
10: Amplifier
11: Control Unit
12: Processing Unit
13: Display Unit
14: Input Unit
15, 15B, 15C, 15D: Specimen Holder
16: Body Portion
17: Specimen Mounting Portion
18: O-ring
19: Guide Pin
20: Grip
22: Voltage Cable
23: Connector
24: Voltage Lead-in Wire
29A: Flat Face
29B: Flat Face
29C: Central Flat Face
29D: Inclined Flat Face
29E: Inclined Flat Face
40: Electron-optical Lens-barrel
101: Central Axis
110: Mounting Hole
111: First Bore
112: Second Bore
121, 121B, 121C, 121D: First Spacer (First Fixing Member)
122, 122B, 122C, 122D: Second Spacer (Second Fixing Member)
130: Drilled Bore
131: Screw
201: Optical-axis-direction Positioning Portion
201A: First Optical-axis-direction Positioning Portion
201B: Second Optical-axis-direction Positioning Portion
202: Mounting-direction Positioning Portion
207A, 221A, 222A: Abutting Portion
211 (211A, 211B): Optical-axis-direction Positioning Face
212A: Mounting-direction Positioning Face
401: Observed Surface
402A, 412A, 512A: Spacer End Face (First Flat Face)
402B, 412B, 512B: Spacer End Face (Second Flat Face)
413A, 513A: Third Flat Surface
413B, 513B: Fourth Flat Surface
501: Optical-axis-direction Reference Plane
502: Vertical-direction Reference Plane
503: Equipotential line
504: Mark
1000: Scanning Electron Microscope (in-lens SEM)

The invention claimed is:

1. A specimen holder comprising:
a specimen mounting portion on which a first fixing member, a cross-sectional specimen as a specimen under observation, and a second fixing member, arranged in close contact with each other, are mounted, and which is to be inserted inside an electron-optical lens-barrel in an electron microscope; and
a voltage introduction means which introduces a voltage to the specimen mounting portion;
wherein the specimen mounting portion includes a positioning portion which positions the first fixing member, the cross-sectional specimen, and the second fixing member in mounting positions; and
the positioning portion positions a first flat face and a second flat face in positions parallel to an observation face and equally distant from the observation face, where the observation face is a cross section to be observed of the cross-sectional specimen, the first flat face is a face of the first fixing member to be arranged adjacent to the observation face, and the second flat face is a face of the second fixing member to be arranged adjacent to the observation face.

2. The specimen holder according to claim 1, wherein the positioning portion positions the first flat face, the second flat face, and the observation face on an identical plane.

3. The specimen holder according to claim 2, wherein the first fixing member, the cross-sectional specimen, and the second fixing member are formed of an identical material.

4. The specimen holder according to claim 1, wherein the positioning portion positions the first flat face and the second flat face in positions which are shifted from the observation face by a desired step difference.

5. The specimen holder according to claim 4, wherein the first fixing member and the second fixing member are formed of an identical material, which is different from a material of which the cross-sectional specimen is formed.

6. The specimen holder according to claim 4, wherein the amount of the desired step difference is determined on the basis of a difference between a material of which the first fixing member and the second fixing member are formed and a material of which the cross-sectional specimen is formed.

7. The specimen holder according to claim 4, wherein the first fixing member has a mark indicating a distance between the observation face and the first flat face when the first fixing member and the cross-sectional specimen are mounted on the specimen mounting portion, and the second fixing member has a mark indicating a distance between the observation face and the second flat face when the second fixing member and the cross-sectional specimen are mounted on the specimen mounting portion.

8. The specimen holder according to claim 1, wherein the positioning portion includes: an optical-axis-direction positioning portion which positions the first fixing member, the cross-sectional specimen, and the second fixing member in mounting positions in an optical-axis direction of a primary electron beam to be applied to the cross-sectional specimen; and a mounting-direction positioning portion which positions the first fixing member, the cross-sectional specimen, and the second fixing member in mounting positions in a mounting direction perpendicular to the optical-axis direction; and
the optical-axis-direction positioning portion positions the first flat face and the second flat face in the positions parallel to the observation face and equally distant from the observation face.

9. The specimen holder according to claim 8, wherein the specimen mounting portion has a mounting hollow in which a first hollow for receiving the first fixing member and a second hollow for receiving the second fixing member are continuously formed, the optical-axis-direction positioning portion is formed with a protruding portion which partially closes an opening opened on a side of the mounting hollow from which the primary electron beam is incident, and the mounting-direction positioning portion is formed with an abutting face which constitutes an internal wall surface surrounding the first hollow in the specimen mounting portion, is arranged in parallel with the optical-axis direction, and abuts a side face of the first fixing member in the mounting direction.

10. The specimen holder according to claim 9, wherein an abutting face in the optical-axis-direction positioning portion which abuts an end face of the first fixing member, an end face of the second fixing member, and an end face of the cross-sectional specimen is formed flat as an optical-axis-direction positioning face, and the abutting face constituting the mounting-direction positioning portion is formed flat as a mounting-direction positioning face.

11. A method for fixing a specimen under observation, comprising:
arranging in advance an optical-axis-direction positioning portion in a specimen mounting portion of a specimen holder, where a first fixing member, a cross-sectional specimen as the specimen under observation, and a second fixing member are to be mounted on the specimen mounting portion in such a manner that the first fixing member, the cross-sectional specimen, and the second fixing member are brought into close contact with each other, the specimen mounting portion is to be inserted inside an electron-optical lens-barrel in an electron microscope, and the optical-axis-direction positioning portion is to position the first fixing member, the cross-sectional specimen, and the second fixing member in mounting positions in an optical-axis direction of a primary electron beam which is to be applied to the cross-sectional specimen;
mounting the first fixing member, the cross-sectional specimen, and the second fixing member on the specimen mounting portion in a mounting direction perpendicularly intersecting with the optical-axis direction, in such a manner that the first fixing member, the cross-sectional specimen, and the second fixing member are brought into close contact with each other, while positioning, by the optical-axis-direction positioning portion, a first flat face and a second flat face in the optical-axis direction in such a manner that the first flat face and the second flat face are parallel with an observation face and are equally distant from the observation face, where the observation face is a cross section to be observed of the cross-sectional specimen, the first flat face is a face of the first fixing member to be arranged adjacent to the observation face, and the second flat face is a face of the second fixing member to be arranged adjacent to the observation face; and
fixing the second fixing member to the specimen mounting portion.

12. The method for fixing a specimen under observation, according to claim 11, further comprising:
arranging in advance a mounting-direction positioning portion in the specimen mounting portion, where the mounting-direction positioning portion is to position the first fixing member, the cross-sectional specimen, and the second fixing member in mounting positions in the mounting direction;
positioning in the mounting positions in the mounting direction, by the mounting-direction positioning portion, the first fixing member positioned in the optical-axis direction by the optical-axis-direction positioning portion;
bringing the cross-sectional specimen and the second fixing member which are positioned in the optical-axis direction by the optical-axis-direction positioning portion, into close contact with the first fixing member; and
fixing the second fixing member to the specimen mounting portion.

13. The method for fixing a specimen under observation, according to claim 11, further comprising:
positioning the specimen holder upside down;
mounting the first fixing member, the cross-sectional specimen, and the second fixing member on the optical-axis-direction positioning portion;
fixing the second fixing member to the specimen mounting portion; and
returning the specimen holder to a normal position.

* * * * *